(12) United States Patent
Sakata et al.

(10) Patent No.: US 7,015,137 B2
(45) Date of Patent: Mar. 21, 2006

(54) SEMICONDUCTOR DEVICE WITH REDUCED INTERCONNECTION CAPACITY

(75) Inventors: Toyokazu Sakata, Tokyo (JP); Hidenori Inui, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/833,190

(22) Filed: Apr. 28, 2004

(65) Prior Publication Data

US 2004/0203226 A1 Oct. 14, 2004

Related U.S. Application Data

(62) Division of application No. 09/736,140, filed on Dec. 15, 2000, now Pat. No. 6,825,566.

(30) Foreign Application Priority Data

Dec. 15, 1999 (JP) .............................. 2000-356196
Nov. 13, 2000 (JP) .............................. 2000-345616

(51) Int. Cl.
*H01L 21/4763* (2006.01)

(52) U.S. Cl. ...................... 438/638; 438/639; 438/640; 438/629; 438/668; 438/672; 438/675; 438/700; 257/774

(58) Field of Classification Search ........ 438/637–640, 438/629, 666–668, 623, 648, 683–685, 672, 438/675, 700–713; 257/700, 774, 762–765
See application file for complete search history.

(56) References Cited

U.S. PATENT DOCUMENTS 5,612,254 A 3/1997 Mu et al.
5,882,996 A * 3/1999 Dai .............................. 438/597
5,998,300 A * 12/1999 Tabara .......................... 438/700
6,043,145 A * 3/2000 Suzuki et al. ................ 438/622
6,204,561 B1 * 3/2001 Yoshizawa ................... 257/751
6,235,629 B1 * 5/2001 Takenaka ..................... 438/638
6,268,279 B1 * 7/2001 Okada .......................... 438/624
6,300,683 B1 * 10/2001 Nagasaka et al. ............ 257/774
6,316,349 B1 * 11/2001 Kim et al. .................... 438/637
6,391,437 B1 * 5/2002 Kadomura et al. ....... 428/307.3
2002/0064941 A1 * 5/2002 Chooi et al. ................. 438/633

FOREIGN PATENT DOCUMENTS

EP 892428 A2 1/1999
JP 9-190985 7/1997

(Continued)

*Primary Examiner*—B. William Baumeister
*Assistant Examiner*—Granvill D. Lee, Jr.
(74) *Attorney, Agent, or Firm*—Venable LLP; James R. Burdett

(57) ABSTRACT

This invention provides a semiconductor device that can ensure that stress on the nitride film is not increased or is reduced, and that can prevent an increase in interconnection capacity. The semiconductor device comprises a underlayer, a base oxide film that is formed on this underlayer, a nitride film pattern with a hole pattern that is provided on this base oxide film, holes that penetrate the base oxide film, an upper oxide film provided on the base oxide film to cover the nitride film pattern, wiring grooves provided through the upper oxide film in which part of the nitride film pattern including the hole pattern is exposed, and wiring metal that fills the holes and wiring grooves. The nitride film pattern is formed with such a shape and size that surrounds the outside of the wiring grooves and is separate from neighbouring nitride film patterns.

7 Claims, 26 Drawing Sheets

FOREIGN PATENT DOCUMENTS

| | | |
|---|---|---|
| JP | 11317451 | 11/1999 |
| JP | 11330046 | 11/1999 |
| JP | 11345875 | 12/1999 |
| JP | 2000-150644 | 5/2000 |

* cited by examiner

SEMICONDUCTOR DEVICE WITH REDUCED INTERCONNECTION CAPACITY

This nonprovisional application is a divisional of U.S. application Ser. No. 09/736,140, filed Dec. 15, 2000 now U.S. Pat. No 6,825,566.

BACKGROUND OF THE INVENTION

1. Field of the Invention

The present invention relates to a semiconductor device structure and its manufacturing method, and more particularly to a manufacturing method for a semiconductor device that uses a dual damascene process in which a metal material is embedded into both a wiring groove and a hole used for the contact between lines.

2. Description of Related Art

Recent years have seen the need for acceleration of semiconductor devices such as LSIs and a trend towards much smaller devices. However, attempts to speed up smaller devices are hampered by line delays. Use of low resist Cu line instead of the conventional Al line is proposed to solve this problem of line delays.

It is difficult to use the dry etching process used when forming Al line on Cu film (or layer) when forming the Cu line. Therefore, the Cu line is formed in a damascene process in which Cu is embedded in a groove provided in an insulation film. The emergence of a dual damascene process in which the metal can be embedded simultaneously in both the wiring groove and in the hole provided for contact between wires means that the number of processes can be reduced compared to the number involved in forming Al line using dry etching. Therefore, the cost of line manufacture can be reduced.

Below, some of the processes involved in the manufacturing method for ordinary semiconductors using the dual damascene process will be briefly explained with reference to FIGS. 24(A)–24(E) through 27.

FIG. 24(A)–24(E) shows the manufacturing processes used for a conventional semiconductor device when the dual damascene process is used. FIG. 24(E) shows a section through the line I—I on FIG. 27. FIG. 27 is a plan view of the semiconductor device as viewed from above after line has been formed. FIG. 25 is a plan view of the mask used for hole formation and FIG. 26 is a plan view of the mask used for line pattern formation.

Firstly, after a base oxide film 102 is formed on an Si substrate 100, a nitride film 104 is formed on this base oxide film 102. Next, after providing a resist on the nitride film 104, photo lithography is implemented using the mask for hole formation 106 shown in FIG. 25. A hole shaped window 108 is provided in the mask 106. This enables the formation of a resist pattern 110 that corresponds to the hole shape (FIG. 24(A)). This resist pattern 110 is then used as a mask for etching that penetrates the nitride film 104. This enables formation of the hole pattern 112 through the nitride film 104 and exposure of the base oxide film 102 from the hole pattern 112 (FIG. 24(B)). Next, an upper oxide film 114 is provided on the remaining nitride film 104x and the exposed base oxide film 102 (FIG. 24(C)). Then, after a resist has been provided on the upper oxide film 114, the resist undergoes photo lithography processing with the use of the mask 116 for line pattern formation as shown in FIG. 26. This mask 116 is provided with a window 118 in the shape of the wire (or line) pattern. This provides the resist pattern 120. The upper oxide film 114 is then etched using this resist pattern 120 as a mask. Following etching, the remaining nitride film 104x is used as a mask for etching of the base oxide film 102. This forms a contact hole 122 so as to penetrate the base oxide film 102 and to expose the surface of the Si substrate 100. At the same time, a wiring groove 124 in the shape of the line pattern can also be formed (FIG. 24(D)). The wiring metal 126 is next embedded in the contact hole 122 and in the wiring groove 124 using a spatter method or plating (FIGS. 24(E) and 27). The surface of the embedded metal 126 is then flattened using chemo-mechanical polishing (CMP) and polished until it is, in practice, level with the surface of the upper oxide film 114. Thus, the contact between interconnections and the interconnection itself can be formed.

However, the nitride film 104x used as the etching mask used for the base oxide film 102 is generally known to have a high dielectric constant and be highly subject to stress. When the nitride film is made thicker to improve its durability in etching or when it is subject to heat processing in later processes in the manufacture of the semiconductor device, the stress placed on it increases. This causes problems such as cracks in the nitride film or deformation of the hole pattern formed in the nitride film. Also, the thicker the nitride film, the greater the interconnection capacity, the cause of line delays.

SUMMARY OF THE INVENTION

Therefore, an object of the present invention is to provide a semiconductor device in which increased interconnection capacity can be prevented and in which the stress that the nitride film is subject to can be limited or decreased. The other object of the present invention is to provide a manufacturing method for semiconductors that avoids the effect of stress on the nitride film during manufacture.

In order to attain the above-mentioned object, the semiconductor device of the present invention has a underlayer, a base oxide film with holes that is formed on this underlayer, a nitride film pattern with a hole pattern that is formed on the base oxide film directly over the holes, an upper oxide film formed on the base oxide film to cover the nitride film pattern, the upper oxide film having formed therethrough a wiring groove wherein part of the nitride film pattern that includes the hole pattern is exposed, and lines that are embedded in the hole and wiring groove. The above nitride film pattern is formed with a shape and size such that its perimeter surrounds the outside of the wiring grooves and does not come into contact with any neighbouring nitride film patterns.

This structure allows the nitride film pattern to be formed with a shape and size that encloses the perimeter of the bottom of the wiring groove. If, in the configuration of the semiconductor device, a plurality of structures with wiring grooves and holes are provided separately, the nitride film pattern is formed with a size and shape that prevents neighbouring nitride film patterns from coming into contact with one another. That is, the perimeter of the nitride film pattern is only slightly larger than the size of the bottom of the wiring groove and therefore much smaller than the total area of the base oxide film. Therefore, the stress placed on the nitride film can be reduced and a semiconductor device made with a low interconnection capacity.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

With reference to drawings, embodiments of the present invention will hereinafter be explained. The figures are only overviews of the shape, size, and arrangement of components to help provide an understanding of the invention and accordingly, the present invention is not limited to the examples pictured. Furthermore, to further clarify the diagrams, hatching to show a cross-section has been omitted except for part of components.

First Embodiment

With reference to FIGS. 1 through 4, an example of the manufacture of a semiconductor using the dual damascene process will be explained as a first embodiment of the present invention.

FIGS. 1 to 3 give overviews of the processes involved in the manufacture of semiconductor devices in the embodiment of the present invention. They provide cross sections taken at positions on the structure during manufacture that have both a hole for a contact between lines and a groove for a line. FIG. 4 is a general schematic view of the mask used in photo lithography processing.

Figure 1A:
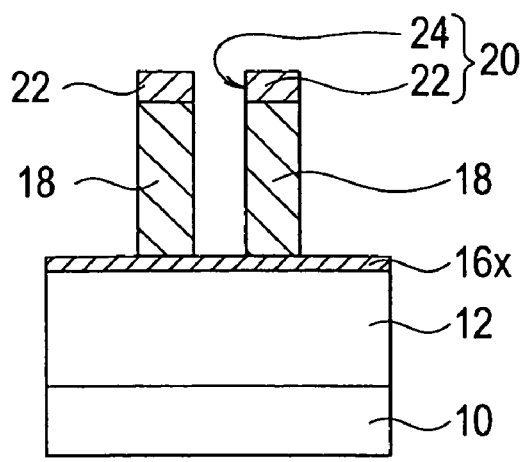
FIGS. 1(A) to 1(C) are diagrams that overview the processes involved in the manufacture of a semiconductor in a first embodiment of the present invention and shows a cross-section through the structure.

Firstly, a base oxide film 12 as a lower oxide film is formed on a underlayer 10 (process 1-1) (FIG. 1(A)).

In this example, the CVD method is used to form an $SiO_2$ film, which is the base oxide film 12, of between 500 and 800 nm in depth on the Si substrate 10 used as the underlayer.

Figure 1B:
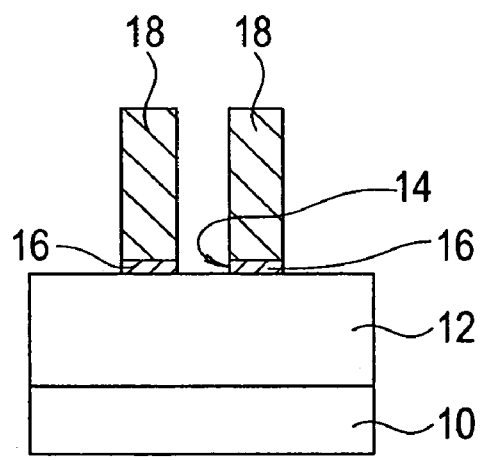

Next, a nitride film pattern 16 with a hole pattern 14 is formed on the base oxide film 12 (process 1-2) (FIGS. 1(A) and 1(B)).

In this example, the CVD method is used to form an $Si_3N_4$ film, as the nitride film 16x, on the $SiO_2$ film 12. A resist film is then placed on the $Si_3N_4$ film 16x and, using commonly used photo lithography technology, a resist pattern 18 that corresponds to the nitride film pattern is formed (FIG. 1(A)).

The configuration of the mask 20 used in this photo lithography is shown in FIG. 4. This mask 20 comprises a transparent mask substrate 21, a line pattern 22 on this mask substrate 21 of a width W2 that is between 0.2 and 1.0 µm larger than the width W1 of the line provided later, and a hole pattern 24 for contacts between lines. There is a plurality of line patterns and each runs parallel to the others. There are also as many hole patterns 24 as required. In this example, the line width W1 is between 0.25 and 1.0 µm and the hole diameter is between 0.1 and 0.5 µm. The device is designed to ensure that the hole diameter is never larger than the line width W1.

In this example, a resist pattern 18 that corresponds to the shape of the nitride film pattern is formed by etching the resist film using this mask 20 (FIG. 1(A)). A nitride pattern 16 with a hole pattern 14 that is between 0.2 and 1.0 µm larger than the line width W1 but much smaller than the size of the upper surface of the $SiO_2$ film 12, is then obtained (FIG. 1(B)).

Figure 1C:
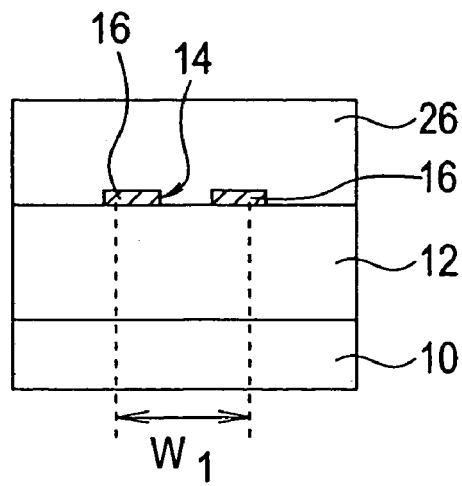

Next, an upper oxide film 26 is formed on the base oxide film 12 to cover the nitride pattern 16 (process 1-3) (FIG. 1(C)).

In this example, the CVD method is used to form an upper oxide film 26 of $SiO_2$ of between 500 and 800 nm in depth on the base oxide film 12 (FIG. 1(C)).

Figure 2A:
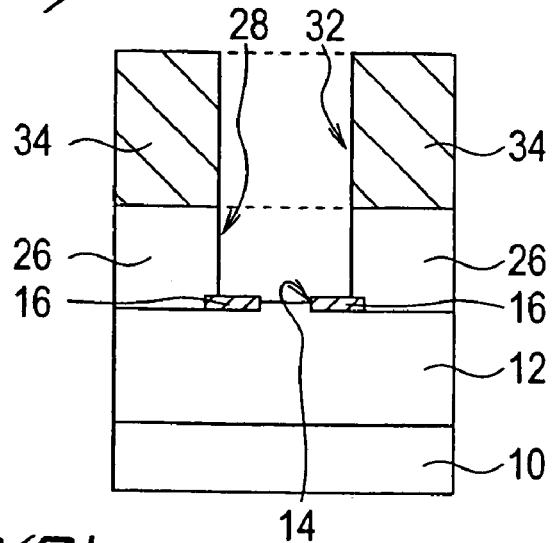
FIGS. 2(A) through 2(C) are also diagrams of the processes involved in the manufacture of a semiconductor device and continue on from FIG. 1.
Figure 2B:
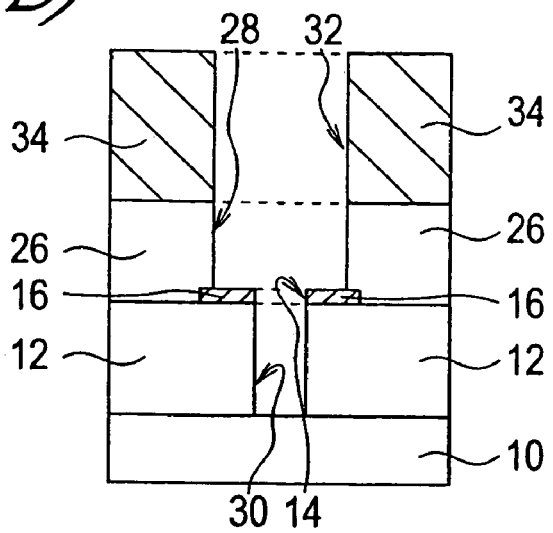

Next, a wiring groove 28 that penetrates the upper oxide film 26 to expose the nitride film pattern 16, and holes 30 that penetrate the base oxide film 12 and expose part of the substrate 10 using the nitride film pattern 16 as a mask are continuously formed in etching (process 1-4) (FIGS. 2(A) and (B)).

In this embodiment of the present invention, after the resist film is formed on the upper oxide film ($SiO_2$ film) it is patterned to form a resist pattern 34 in which the wiring groove pattern becomes the window 32. Next, the resist pattern 34 is used as a mask in dry etching using $C_4F_8/O_2/Ar$ gases which etches the upper oxide film 26 that is exposed from the window 32. Also, the dry etching used is anisotropic etching in which medium density plasma (with a plasma density of between $10^{11}$ and $10^{12}$ $cm^{-3}$) is used. Etching of the upper nitride film 26 ends when the surface of the nitride film pattern 16 lying between the upper oxide film 26 and base oxide film 12 is exposed (FIG. 2(A)). After this, the base oxide film 12 that has been exposed from the hole pattern 14 is etched with the nitride film pattern 16 that has been exposed from the bottom of the opening in the upper oxide film 26 being used as a mask. Etching of the base oxide film 12 ends when the surface of the Si substrate 10 is exposed from the hole pattern 14. The wiring groove 28 and hole 30 are formed through this process (FIG. 2(B)).

Figure 2C:
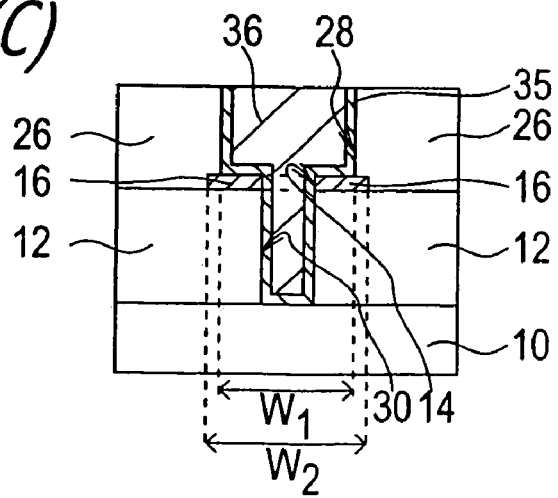

Next, the wiring metal 36 is embedded in the hole 30, on part of the area of the exposed nitride film pattern 16, and in the wiring groove 28 (process 1-5: dual damascene process) (FIG. 2(C)).

Figure 3A:
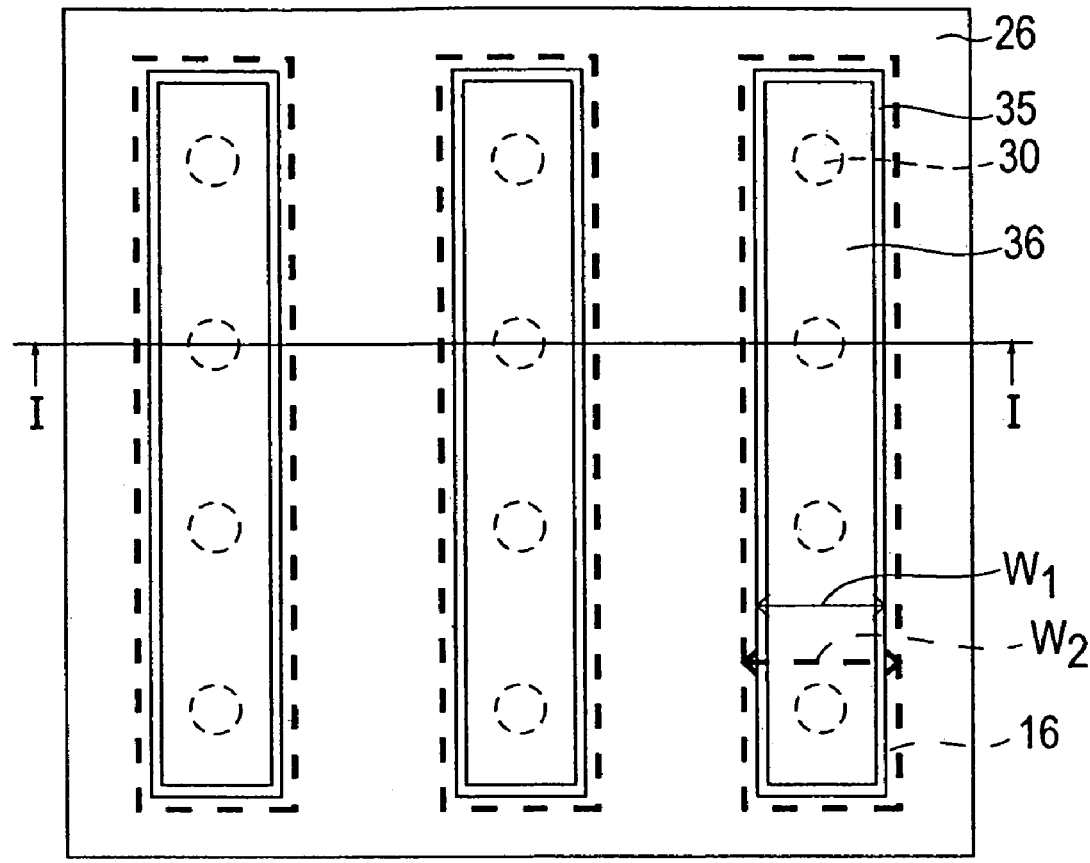
FIGS. 3(A) and 3(B) are a plan view and corresponding cross-sectional view schematically showing the semiconductor device of FIG. 2.
Figure 4:
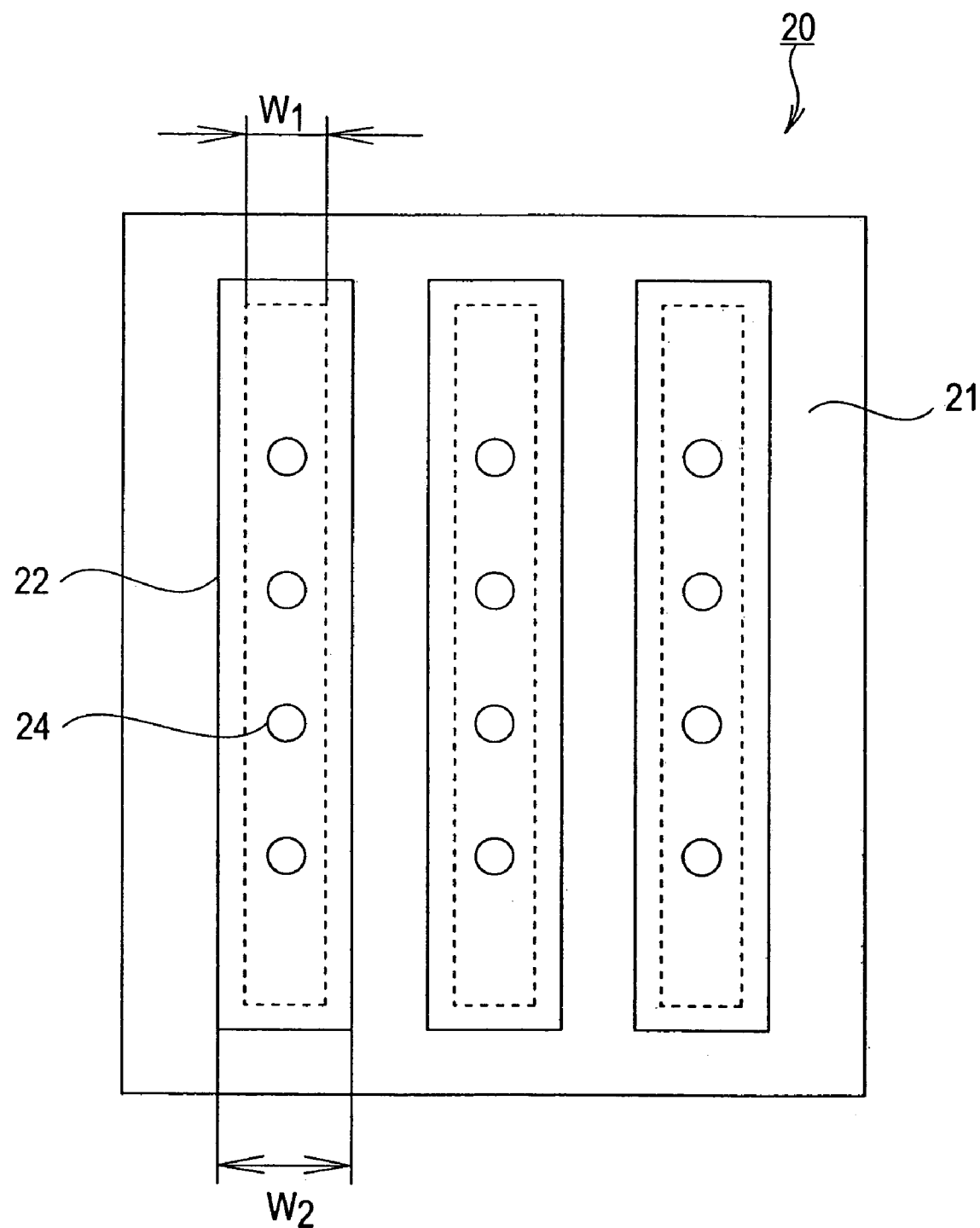
FIG. 4 is a general schematic view of the mask used in photo lithography.

FIG. 3(A) shows a partial plan view of a semiconductor device obtained according to the process mentioned above with reference to FIGS. 1 and 2.

Figure 3B:
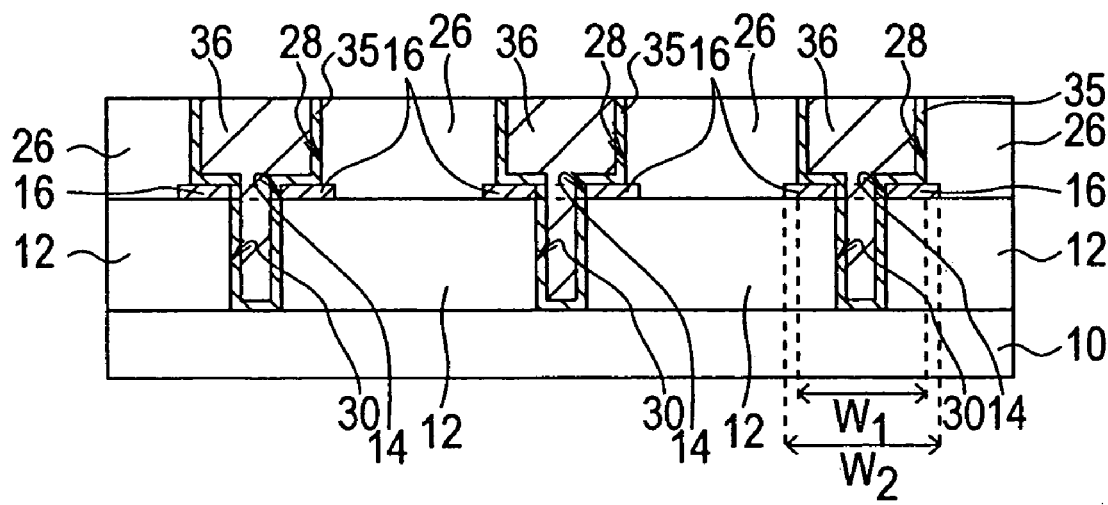

FIG. 3(B) shows a cross-sectional view taken along the line I—I of FIG. 3(A).

In this example, after for example a 50 nm thick barrier metal layer 35 is formed in the hole 30 and groove 28 using the CVD method, plating is used to embed Cu 36 in the hole 30 and wiring groove 28. When the hole 30 has been completely filled with the barrier metal layer 35, the Cu 36 can be embedded just into the wiring groove 28 in which case the spatter method can be used. Also, in this example, Cu was used as the wiring metal 36 to lower the line capacity. However, Al alloys can also be used as the metal for lines and contacts between lines.

Next, CMP processing of the part in which the Cu 36 is embedded is used to form the contact between lines and the metal lines (FIG. 2(C)).

As a result, as is clear from the above explanations, the nitride film pattern 16 is formed to be between 0.2 and 1.0 µm larger than the opening of the wiring groove 28. Accordingly, as in conventional methods, in the etching that forms the wiring groove 28 and the hole 30, after etching of the upper oxide film 26 ends, the nitride film pattern 16 acts as an etching mask to protect the base oxide film 12 so that it is not exposed except within the hole pattern 14.

The nitride film pattern 16 is provided only where necessary on the base oxide film 12 and therefore is smaller than in conventional semiconductor devices. Accordingly, the stress placed on the nitride film pattern 16 is less than in conventional devices. This enables the deformation of formed holes and cracks in the nitride film caused by stress to be avoided.

Second Embodiment

With reference to FIGS. 5, 6 and 7, an example of the formation of a nitride film pattern using a method different to that used in the first embodiment will be explained as a second embodiment of the present invention.

FIGS. 5 and 6 provide overviews of the processes involved in the manufacture of the semiconductor devices of this embodiment of the present invention. They provide cross sections taken at positions on the structure during manufacture that have both a hole for the contact between lines and a groove for line.

Figure 7A:
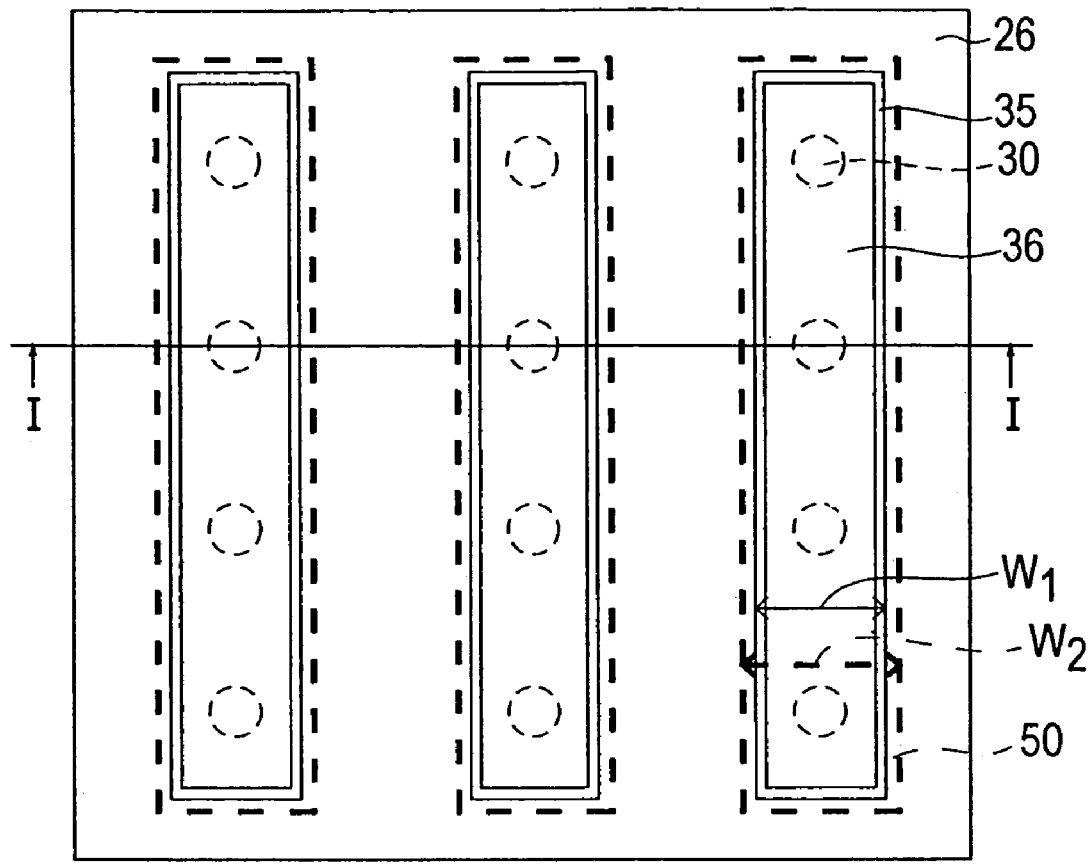
FIGS. 7(A) and 7(B) are a plan view and corresponding cross-sectional view schematically showing the second embodiment of a semiconductor device.
Figure 7B:
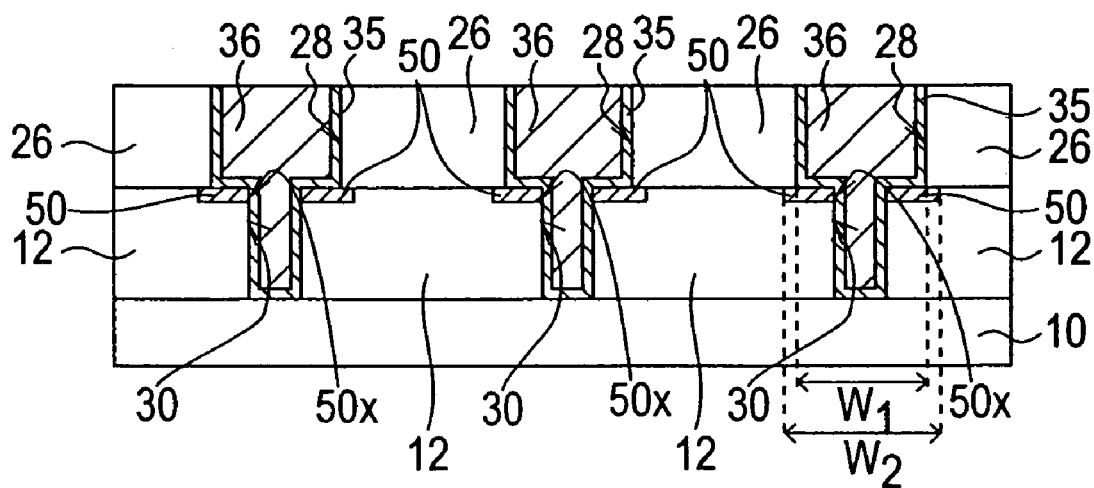

FIGS. 7(A) and 7(B) show a partial plan view of a semiconductor device of the second embodiment of the present invention and a cross-sectional view taken along the line I—I of FIG. 7(A), respectively.

Below, those points that differ from the first embodiment will be explained and detailed explanation of those points that are the same, as the first embodiment will be omitted.

Figure 5A:
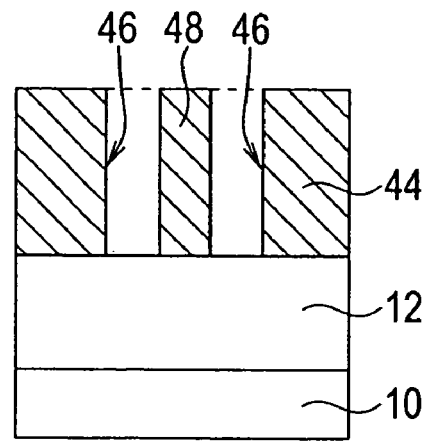
FIGS. 5(A) through 5(C) are general diagrams of the processes involved in the manufacture of a semiconductor device in a second embodiment of the present invention, and show cross-sections through the structure.

Firstly, the base oxide film 12 is formed on the substrate 10 (process 2-1) (FIG. 5(A)).

In this example, as with the first embodiment, the CVD method is used to form an $SiO_2$ film 12 of between 500 and 800 nm in depth on the Si substrate 10.

Figure 5B:
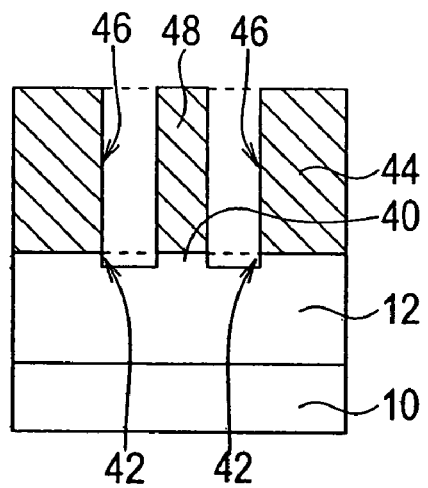

Next, a groove 42 for nitride film pattern formation is formed within the area of the base oxide film 12 (process 2-2) (FIGS. 5(A) and 5(B)).

In this example, firstly a resist film is formed on the $SiO_2$ film 12. The resist pattern 44 is then formed by photo lithography using a mask that is the reverse of the mask in FIG. 3 (FIG. 5(A)). The resist pattern 44 thus obtained has a line shaped window 46 that is between 0.2 and 1.0 µm wider than the line width W1 and a hole shaped island 48 formed in this window 46. This resist pattern 44 can also be formed as follows. That is, a negative resist can be provided on the $SiO_2$ film 12 and photo lithography implemented using the same mask 20 as in FIG. 4 (FIG. 5(A)).

Next, this resist pattern 44 is used as a mask for etching of the $SiO_2$ film 12 to form a groove 42 for forming a nitride film pattern of between 100 and 300 nm in depth. This etching causes an island 40 in the shape of the hole pattern to remain within the groove 42 for the nitride film pattern formation, that is an island enclosed by the groove (FIG. 5(B)).

Figure 5C:
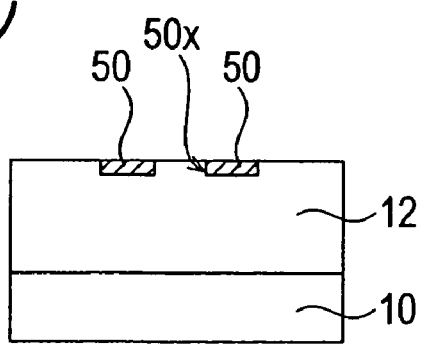

Next, the material for the nitride film is embedded in the groove 42 for forming the nitride film pattern and a nitride film pattern 50 with a hole pattern 50x is formed (process 2-3) (FIG. 5(C)).

In this embodiment of the present invention, firstly material for the nitride film is embedded in the groove 42 for forming the nitride film pattern. Then, CMP processing of this nitride film material is implemented. This enables a nitride film pattern 50 that is between 0.2 and 1.0 µm wider than the line width W1 and that has a hole pattern 50x to be formed in the groove 42 (FIG. 5(C)).

Figure 6A:
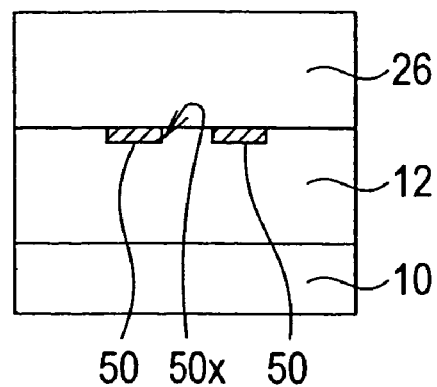
FIGS. 6(A) through 6(C) are also diagrams of the processes involved in the manufacture of a semiconductor device and continue on from FIG. 5.

Next, an upper oxide film 26 is formed on the base oxide film 12 that includes the nitride film pattern 50 (process 2-4) (FIG. 6(A)).

In this example, the CVD method is used to form an SiO$_2$ film of between 500 and 800 nm in depth as the upper oxide film 26 on the base oxide film (SiO$_2$ film) (FIG. 6(A)).

Next, the same etching processing is used to continuously form a wiring groove 28 and holes 30. The wiring groove 28 penetrates the upper oxide film 26 to expose part of the nitride film pattern 50, which includes the hole pattern 50x. The holes 30 penetrate the base oxide film within the hole pattern 50x to expose part of the substrate 10 (process 2-5) (FIG. 6(B)).

Figure 6B:
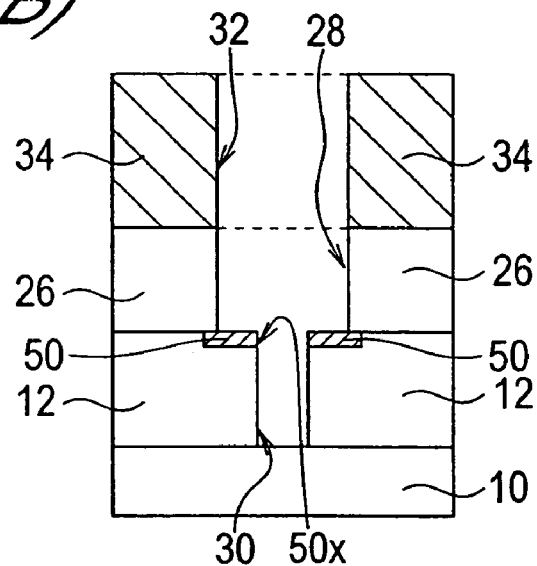
Figure 6C:
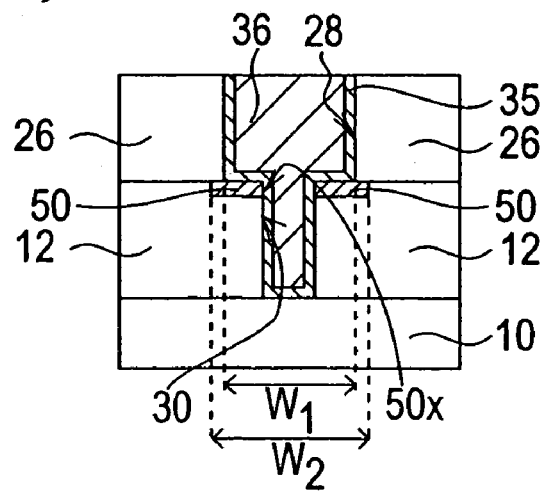

The wiring metal 36 is then embedded into the holes 30, part of the area of the exposed nitride film pattern 50, and the wiring groove 28 (2-6) (FIG. 6(C)).

In this example, as in the first embodiment, after the resist pattern 34, which has a window 32 in the shape of the wiring groove pattern, has been formed on the upper oxide film 26, dry etching is performed using this resist pattern 34 as the mask (FIG. 6(B)). Then, after the CVD method is used to form the barrier metal layer 35 inside the hole 30 and wiring groove 28 formed by dry etching, plating is used to embed Cu, as the wiring metal 36, in this wiring groove 28 and hole 30. Then, by implementing CMP processing of the Cu 36 surface exposed from the wiring groove, the height of the surface of the Cu 36 can be made the same as the height of the upper surface of the upper oxide film 25. The contact between lines and the metal lines can be formed through the above processes (FIG. 6(C)).

Consequently, as is made clear in the above explanations, as in the first embodiment, the nitride pattern 50 with its width W2 is formed to a size whereby its perimeter encloses the wiring groove 28. More specifically, it is formed to a size that is between 0.2 and 1.0 $\mu$m larger than the width W1 of the wiring groove opening (FIGS. 6(C), 7(A) and 7(B)). Accordingly, in the etching that forms the wiring groove 28 and hole 30, after etching of the upper oxide film 26 ends the nitride pattern 50 acts as the etching mask to protect the base oxide film 12 as in conventional methods, without exposing the base oxide film except within the hole pattern 50x.

The nitride film pattern 50 is established only where it is needed on the base oxide film 12, as in this embodiment, and it can be made smaller than in conventional semiconductor devices. Accordingly, the stress on the nitride film pattern 50 can also be reduced. This enables deformation of formed holes and cracks in the nitride film caused by stress to be avoided.

Third Embodiment

With reference to FIGS. 8, 9 and 10, an example of the formation of a nitride film pattern using a method different to that used in either the first or second embodiment will be explained as a third embodiment of the present invention.

FIGS. 8 and 9 provide overviews of the processes involved in the manufacture of the semiconductor devices of this embodiment of the present invention. They provide cross sections taken at positions on the structure during manufacture that have both a hole for the contact between lines and a groove for line.

Figure 10A:
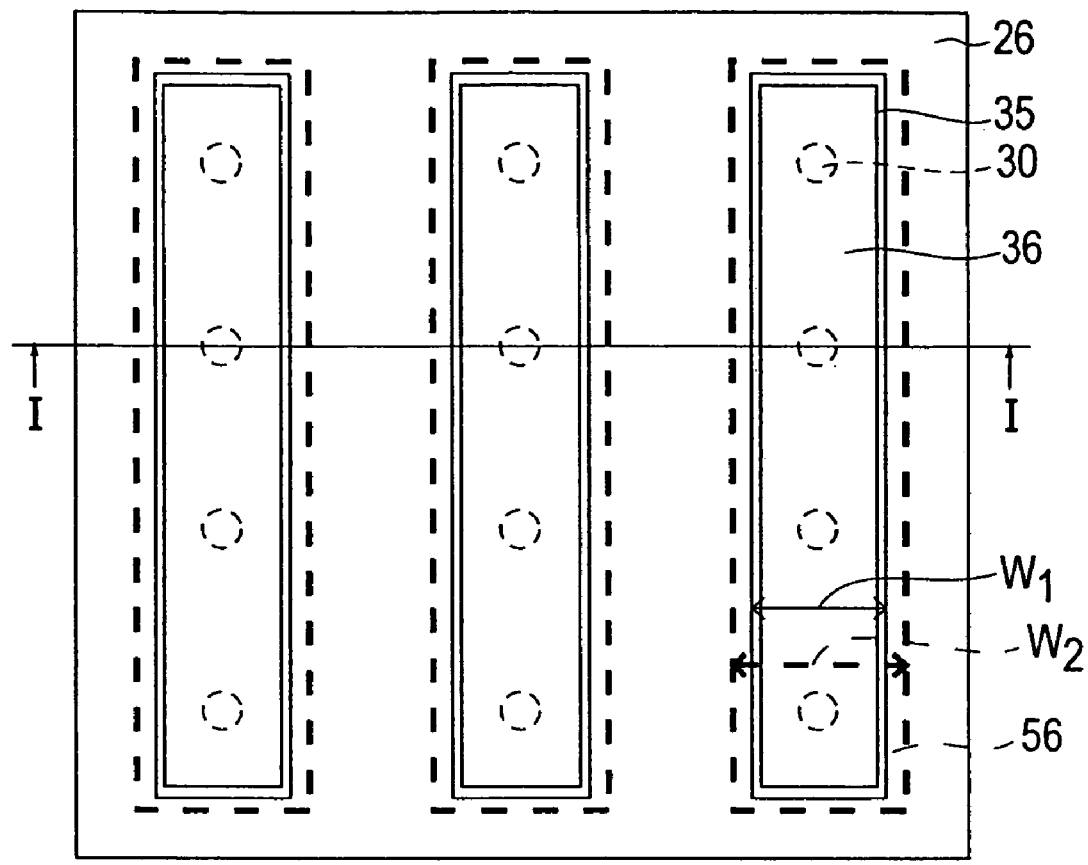
FIGS. 10(A) and 10(B) are a plan view and corresponding cross-sectional view schematically showing the third embodiment of a semiconductor device.
Figure 10B:
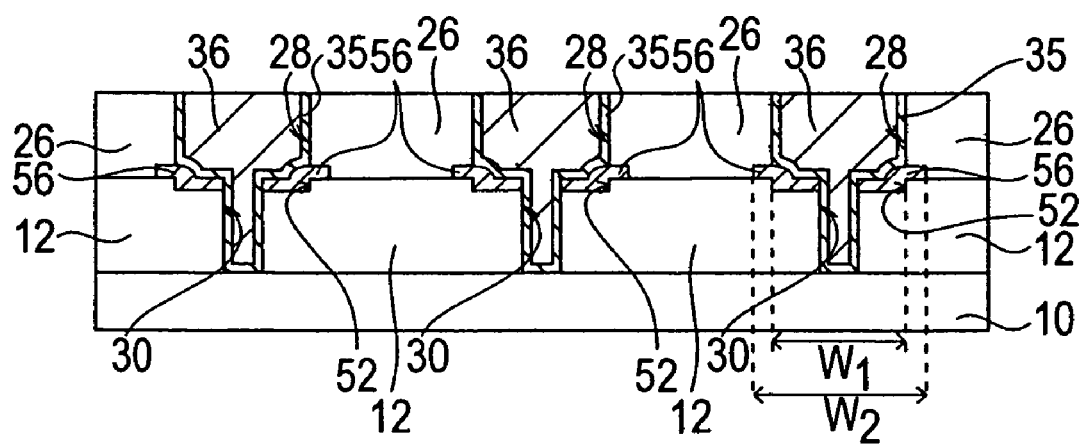

FIGS. 10(A) and 10(B) show a partial plan view of a semiconductor device of the third embodiment of the present invention and a cross-sectional view taken along the line I—I of FIG. 10(A), respectively.

Below, those points that differ from the first and second embodiments will be explained and detailed explanation of those points that are the same as the first and second embodiments will be omitted.

Figure 8A:
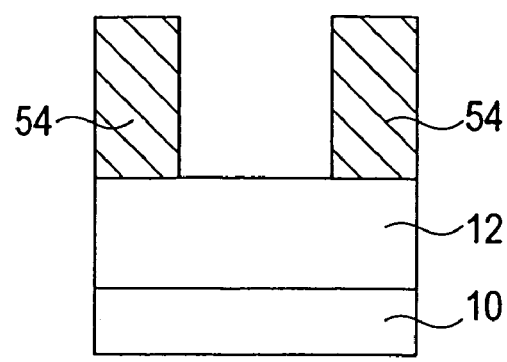
FIGS. 8(A) through 8(D) are general diagrams of the processes involved in the manufacture of a semiconductor device in a third embodiment of the present invention, and show cross-sections through the structure.

Firstly, the base oxide film 12 is formed on the substrate 10 (process 3-1) (FIG. 8(A)).

In this example, as in the first and second embodiments, the CVD method is used to form an SiO$_2$ film 12 of between 500 and 800 nm in depth on the Si substrate 10.

Figure 8B:
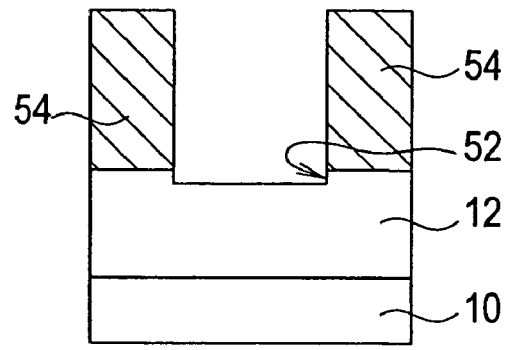

Next, a groove 52 with a opening shaped in the same way as the wiring groove to be formed later is formed on the base oxide film 12 (process 3-2) (FIG. 8(B)).

In this example, firstly a resist film is formed on the SiO$_2$ film 12. Then a mask with a window pattern that is the same shape and size as the wiring groove to be formed later is used in photo lithography processing for this resist film to form the resist pattern 54 (FIG. 8(A)). Next, this resist pattern 54 is used as a mask in the etching of the SiO$_2$ film 12 to form a groove 52 of a depth between 100 and 300 nm (FIG. 8(B)).

Figure 8C:
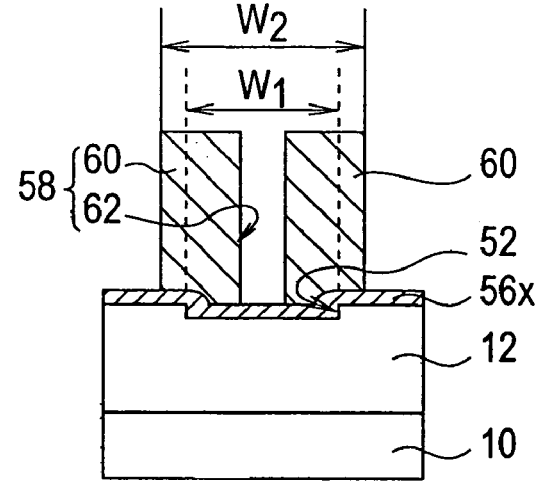

Next, a nitride film 56x is formed on the base oxide film 12 including within the groove 52 (process 3-3) (FIG. 8(C)).

In this example, an Si$_3$N$_4$ film, as the nitride film 56x, is formed on the base oxide film 12, including the groove 52, to a depth of between 150 and 300 nm.

Next, the nitride film 56x is etched so that the hole pattern is formed substantially in the centre of the groove 52 and of a size and shape that ensures that it encloses the groove 52. This forms a nitride film pattern 56 with a hole pattern 64 (process 3-4) (FIGS. 8(C) and 8(D)).

In this example, as in the first embodiment of the present invention, a resist film is provided on the nitride film 56x and photo lithography processing is implemented using the same mask as in FIG. 4. This provides the resist pattern 58 that corresponds to the shape of the nitride film pattern. The resist pattern 58 has a line pattern of a width W2, which is between 0.2 and 1.0 $\mu$m larger than the width W1 of the line to be formed later, and a hole pattern 62 for the contact between lines (FIG. 8(C)).

Figure 8D:
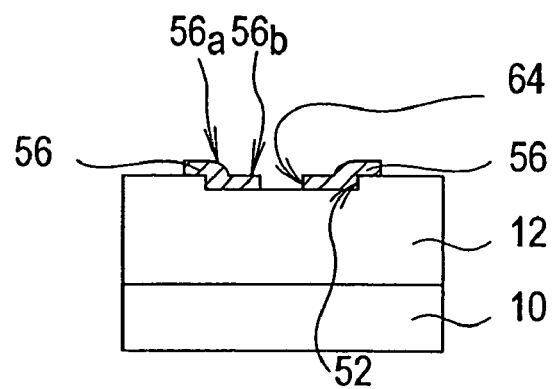

The resist pattern 58 is then used as a mask in the etching of the Si$_3$N$_4$ film 56x to form the nitride film pattern 56 (FIG. 8(D)). The nitride film pattern 56 thus obtained has a hole pattern 64 and part of it is formed more thickly because of the step in the groove 52 formed under the nitride film pattern 56. In other words, the (nitride film pattern) part 56a around the side wall of the groove 52 formed on the base oxide film 12 is thicker than the (nitride film pattern) part 56b formed on the bottom of the groove 52.

Figure 9A:
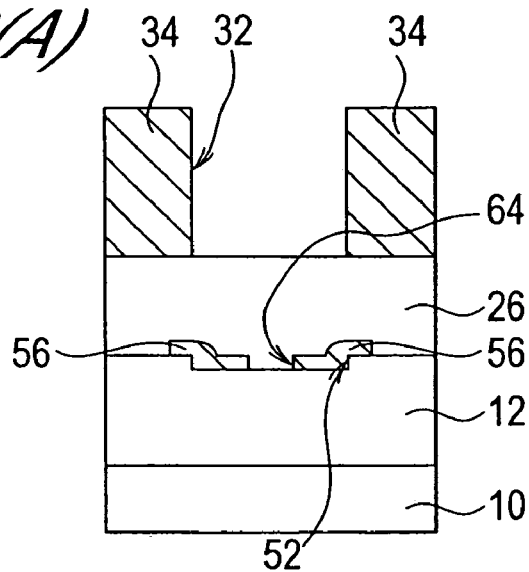
FIGS. 9(A) through 9(C) are also diagrams of the processes involved in the manufacture of a semiconductor device and continue on from FIG. 8.

Next, the upper oxide film 26 is formed on the base oxide film 12 that includes the nitride film pattern 56 (process 3-5) (FIG. 9(A)).

In this embodiment of the present invention, the CVD method is used to form an SiO$_2$ film, as the upper oxide film 26, to a depth of between 500 and 800 nm on the base oxide film (SiO$_2$ film).

Figure 9B:
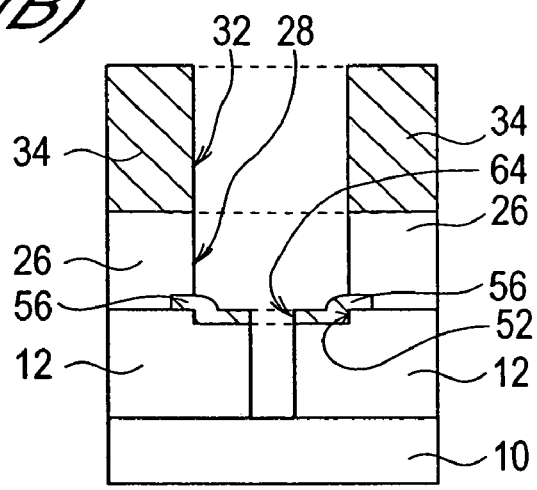

Next, the same etching processing is used to form the wiring groove 28 that penetrates the upper oxide film 26 to expose part of the area that includes the hole pattern 64 in the nitride film pattern 56 and to form the hole 30 that penetrates the base oxide film 12 in the hole pattern 64 to expose part of the substrate 10 (process 3-6) (FIGS. 9(A) and 9(B)).

Therefore, in this example, as in the first and second embodiments, after formation of the resist pattern 34 with the window 32 shaped in the wiring groove pattern on the upper oxide layer 26 (FIG. 9(A)), this resist pattern 34 is used as a mask in dry etching.

In this etching process, the upper oxide film 26 is first etched but the etching rate for the area around the side wall of the wiring groove 28 is higher than that for the central part of the groove 28. Therefore, when etching of the upper oxide film 26 ends, the bottom of the side wall of the wiring groove is excessively etched. Also, the etching of the upper oxide film 26 ends when the nitride film pattern 56 works as a stopper. In this example, the nitride film pattern 56 can be formed so that the part around the side wall 56a of the wiring groove 28 is thicker than the part on the bottom of the groove 56b (near the center). Accordingly, even when there has been excessive etching, the base oxide film 12, which is beneath the area 56a with the nitride film pattern, can be protected. Also, a thick nitride film pattern 56 is only provided in areas where there is excessive etching and so the whole of the nitride film pattern 56 need not be made thick. Accordingly, there is no danger of the interconnection capacity of the semiconductor device increasing after manufacture (FIG. 9(B)).

Figure 9C:
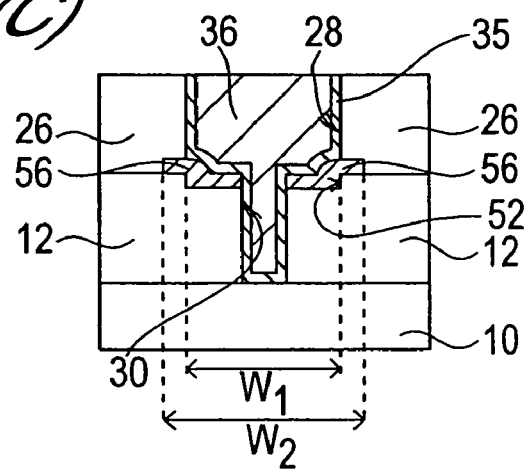

Next, the wiring metal 36 is embedded in the hole 30, part of the area of the exposed nitride film pattern 56, and in the wiring groove 28 (process 3-7) (FIG. 9(C)).

In this example, after the CVD method is used to form a barrier metal layer 35 in the wiring groove 28 and hole 30 formed through dry etching, plating is used to embed Cu as the wiring metal 36 in this wiring groove 28 and hole 30. By CMP processing the upper oxide film 26 and the part into which Cu 36 has been embedded, the surface exposed by the upper oxide film 26 and Cu 36 is flattened and the contacts between lines and metal lines can be formed (FIG. 9(C)).

As a result, as in the first and second embodiments, in this embodiment, the nitride film pattern 56 with its width W2 is formed so that it is between 0.2 and 1.0 μm bigger than the width W1 of the wiring groove 28 (FIGS. 8(C), 9(C), 10(A) and 10(B)). Therefore, in etching to form the wiring groove 28 and hole 30, after etching of the upper oxide film 26, the nitride film pattern 56 acts as a etching mask to protect the base oxide film 12, as in conventional methods, so that the base oxide layer 12 is not exposed except for within the hole pattern 64.

The nitride film pattern 56 is established only where it is needed on the base oxide film 12, as in this embodiment, and so the pattern can be made smaller than in conventional semiconductor devices. Accordingly, the stress on the nitride film pattern 56 can also be reduced. This enables deformation of formed holes and cracks in the nitride film caused by stress to be avoided.

Fourth Embodiment

With reference to FIGS. 11, 12 and 13, an example of the formation of the side wall at the end of the nitride film pattern will be explained as a fourth embodiment of the present invention.

FIGS. 11 and 12 provide overviews of the processes involved in the manufacture of the semiconductor devices of this embodiment of the present invention. They provide cross sections taken at positions on the structure during manufacture that have both a hole for the contact between lines and a groove for line.

Figure 13A:
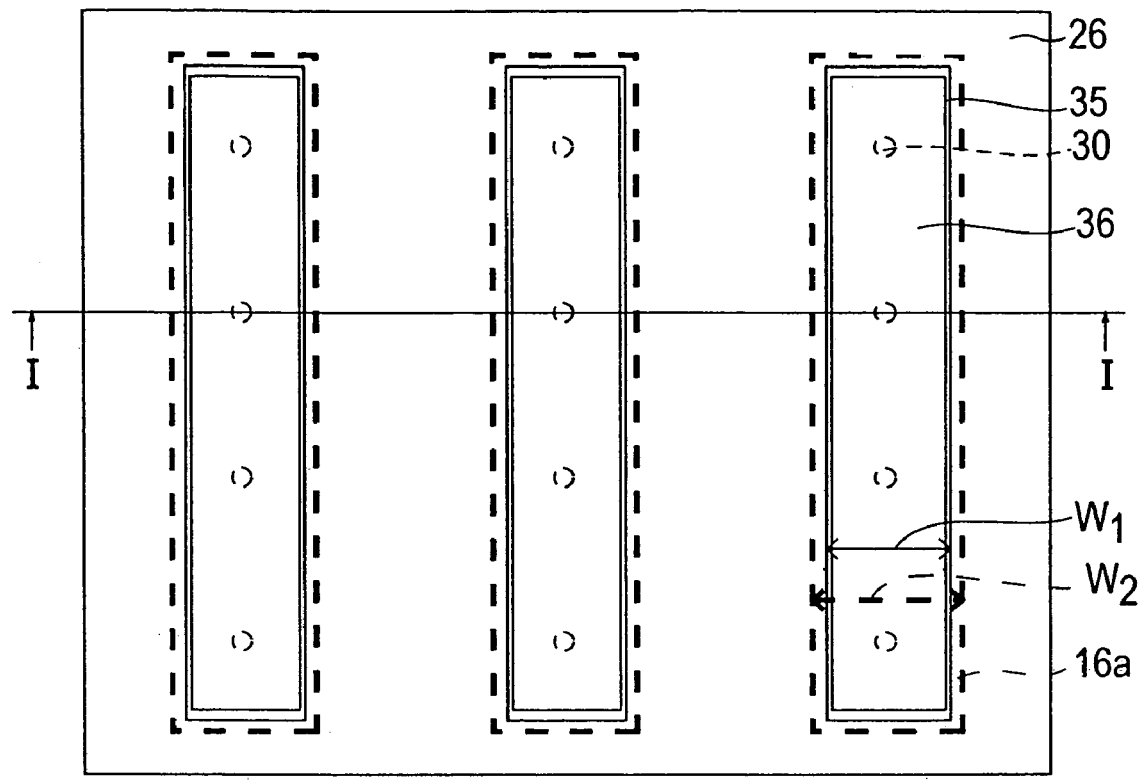
FIGS. 13(A) and 13(B) are a plan view and corresponding cross-sectional view schematically showing the fourth embodiment of a semiconductor device.
Figure 13B:
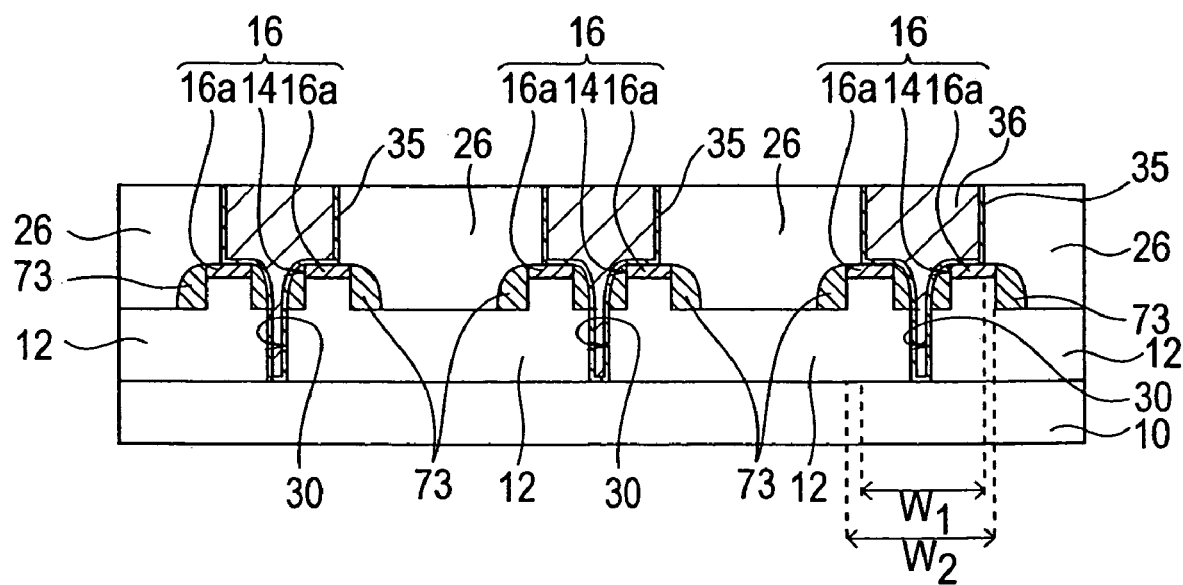

FIGS. 13(A) and 13(B) show a partial plan view of a semiconductor device of the fourth embodiment of the present invention and a cross-sectional view taken along the line I—I of FIG. 10(A), respectively.

Below, those points that differ from the first, second, and third embodiments will be explained and detailed explanation of those points that are the same as the first, second, and third embodiments will be omitted.

Figure 11A:
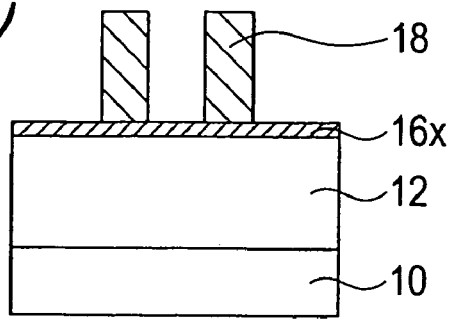
FIGS. 11(A) through 11(D) are general diagrams of the processes involved in the manufacture of a semiconductor device in a fourth embodiment of the present invention, and show cross-sections through the structure.

Firstly, the base oxide film 12 is formed on the substrate 10 (process 4-1) (FIG. 11(A)).

In this example, as in the first through third embodiments of the present invention, the CVD method is used to form a $SiO_2$ film 12 of between 500 and 800 nm in depth on the Si substrate 10.

Next, a nitride film pattern 16 with a hole pattern 14 is formed in the area that encloses the outside of the wiring groove to be formed later (process 4-2) (FIGS. 11(A) and 11(B)).

In this example, as in the first embodiment, the CVD method is used to form a $Si_3N_4$ film of between 150 and 300 nm in depth as the nitride film 16x on the $SiO_2$ film 12. A resist film is then provided on the $Si_3N_4$ film 16x and then photo lithography technology is used to form a resist pattern 18 that corresponds to the nitride film pattern (FIG. 11(A)). Then, the nitride pattern 16 is formed by etching the $Si_3N_4$ film 16x using the resist pattern 18 as a mask. In this embodiment, the nitride film pattern 16 is formed from a line pattern 16a of a width W2 that is between 0.2 and 1.0 μm larger than the width W1 of the line to be laid in a later process and a hole pattern 14 formed in this line pattern 16a for contact between lines x.

Figure 11B:
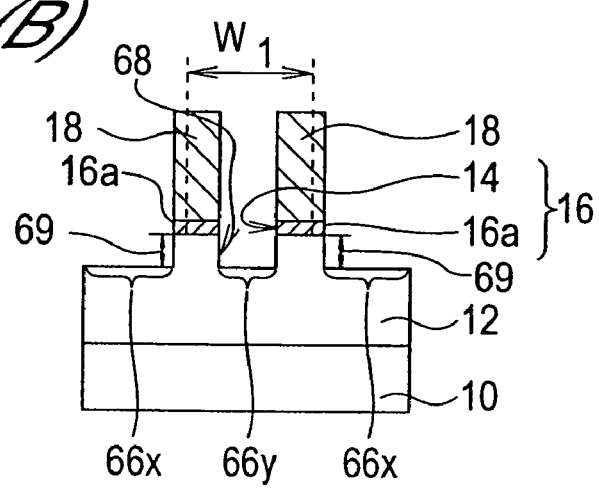

Next, the nitride film pattern 16 is used as a mask and by etching the area of the base oxide film 12 exposed from the nitride pattern 16 from the surface of this area in the direction of the thicker base oxide film 12, at least a groove for formation of the side wall is formed on the base oxide film exposed from the hole pattern (process 4-3) (FIG. 11(B)).

In this example, the nitride film pattern 16 is used as a mask to dry-etch the exposed part of the base oxide film 12 to a depth of between 100 and 300 nm and this forms the groove 68 for formation of the side wall. Etching is difficult to control if the depth of the groove 68 is less than 100 nm. The side wall created later will also be low and therefore will be inadequate for acting as an etching stopper. For this reason, a groove 68 depth of between 100 and 300 nm is preferable. The groove for side wall formation 68 is formed in the area 66y of the base oxide layer inside the hole pattern provided in the nitride film pattern 16. This etching results in the formation of a step 69 between the area 66x of the base oxide film outside the nitride film pattern 16 and the upper surface of the nitride film pattern 16(FIG. 11(B)).

Figure 11C:
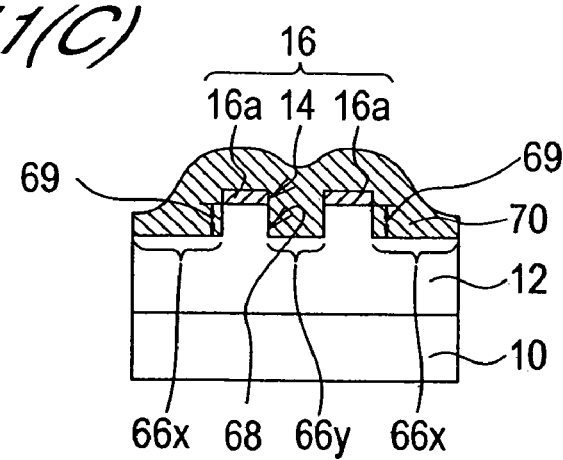

Next, a groove for side wall formation 68 and a film for side wall formation 70 on the nitride film pattern 16 are formed (process 4-4) (FIG. 11(C)).

In this example, the CVD method is used to form a polysilicon film of between 100 and 300 nm in depth as the side wall film 70 in the groove for side wall formation 68, on the step 69, on the nitride film pattern 16, and on the exposed base oxide film 12 (FIG. 11(C)).

Figure 11D:
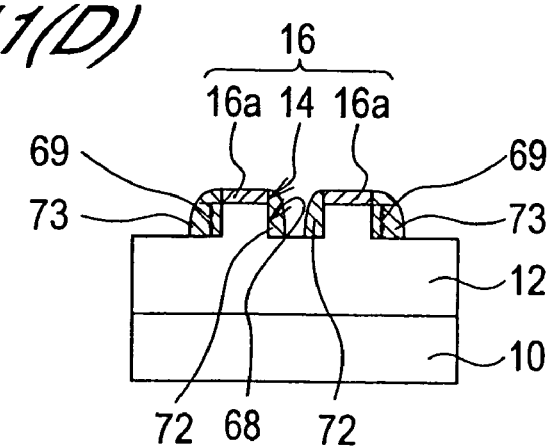

Next, etching of the side wall film 70 is implemented to expose the surface of the nitride film pattern 16 and thus form the side wall 72 on the side of the groove 68 for side wall formation (process 4-5) (FIG. 11(D)).

Here, anisotropic dry etching using $Cl_2$ gas (chlorine gas) is implemented until the surface of the nitride film pattern 16 is exposed from underneath the polysilicon film 70. This enables formation of the side wall 72 of the polysilicon film on the side wall of the groove 68 for side wall formation formed on the base oxide film 12. Also, the side wall 73 on the step 69 is formed through etching (FIG. 11(D)).

Figure 12A:
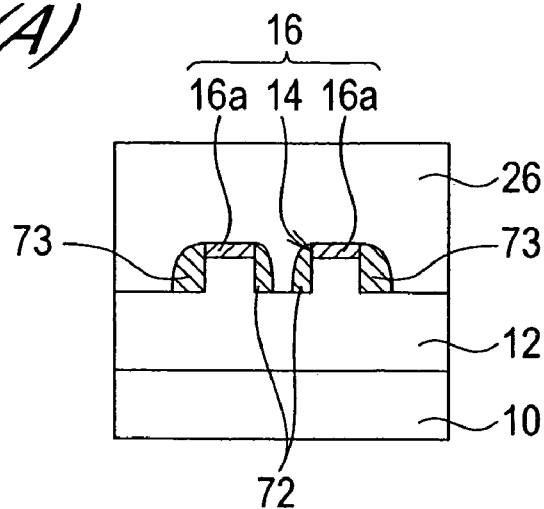
FIGS. 12(A) through 12(C) are also diagrams of the processes involved in the manufacture of a semiconductor device and continue on from FIG. 11.

Next, the upper oxide film 26 is formed on the side walls 72 and 73, on the base oxide film 12 exposed from the side walls 72 and 73 and on the nitride film pattern 16 (process 4-6) (FIG. 12(A)).

In this example, an $SiO_2$ film of between 500 and 800 nm in depth is formed, as the upper oxide film 26, on the side walls 72 and 73, and on the base oxide film 12 exposed from the side walls 72 and 73, and on nitride film pattern 16 (FIG. 12(A)). This upper oxide layer 26 is formed using the CVD method.

Figure 12B:
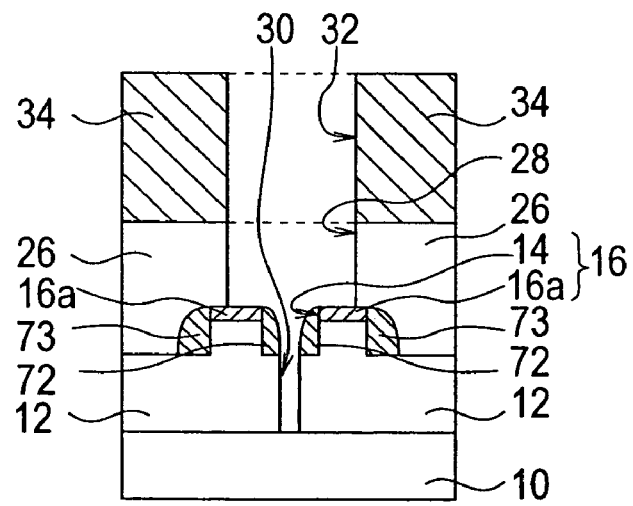

Next, the same etching processing is used to continuously form wiring grooves 28 that penetrate the upper oxide film 26 to expose some of the area of the nitride film pattern 16 that includes the hole pattern 14 and holes 30 that penetrate the base oxide film 12 exposed from the side wall 72 to expose part of the substrate 10 (process 4-7) (FIG. 12(B)).

In this example, as in the first through third embodiments of the present invention, after the resist film is formed on the upper oxide film 26 it is patterned to form the resist pattern 34 in which the wiring groove pattern becomes the window 32. This resist pattern 34 is then used as a mask in dry etching to firstly form a wiring groove 28 through the upper oxide film 26. The nitride film pattern 16 is exposed at the bottom of the wiring groove 28. Next, using the nitride film pattern 16 and the side wall 72 formed in the hole pattern 14 as masks, the base oxide film 12 exposed from the side wall 72 is etched until the Si substrate is exposed. This causes formation of wiring groove 28 and the hole 30 for the contact between lines (FIG. 12(B)).

Figure 12C:
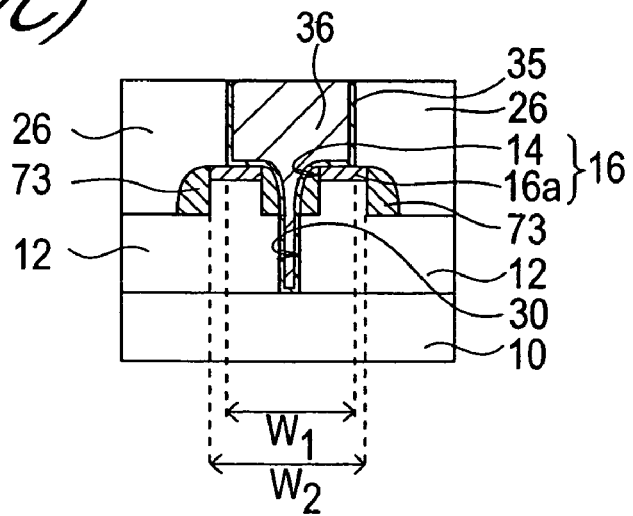

Next, the wiring metal 36 is embedded in the hole 30, on the exposed side wall 72, on part of the exposed nitride film pattern 16 area, and in the wiring groove 28 (process 4-8) (FIG. 12(C)).

In this example, as in the first through third embodiments of the present invention, after the CVD method is used to form the barrier metal layer 35 in the wiring groove 28 and hole 30, plating is used to embed Cu as the wiring metal 36 in this wiring groove 28 and hole 30. Then, CMP processing of the embedded Cu 36 is implemented to flatten the upper oxide film 26 and the exposed surface of the Cu 36 and to enable formation of the contact between lines and metal lines (FIG. 12(C)).

As a result, as in the first through third embodiments of the present invention, the nitride film pattern 16 with its width W2 is formed so that the perimeter of the pattern 16 is between 0.2 and 1.0 μm larger than the width W1 of the opening of the wiring groove 28 (FIGS. 12(C), 13(A) and 13(B)). Therefore, in etching to form the wiring groove 28 and hole 30, after etching of the upper oxide film 26 ends, the nitride film pattern 16 acts as an etching mask to protect the base oxide film 12 without exposing it except within the hole pattern 14.

Also, in this embodiment, the nitride film pattern 16 is established only where it is needed on the base oxide film 12 and so the pattern can be made smaller than in conventional semiconductor devices. Accordingly, the stress on the nitride film pattern 16 can also be reduced. This enables deformation of formed holes and cracks in the nitride film caused by stress to be avoided.

Also, in this embodiment, particularly during etching of the base oxide film 12, thought has been placed into the design of the structure of the base oxide film 12 around the end (opening) of the hole pattern 14, where durability in etching of the nitride film pattern that acts as the mask is low. That is, immediately after formation of the nitride film pattern 16, this nitride film pattern 16 is used as a mask and a groove 68 for side wall formation is prepared in the area intended for hole formation in the base oxide film 12 (refer to FIG. 11(B)). On this groove 68 for side wall formation, a side wall 72 made of a polysilicon film that has a higher etching selection ratio for an $SiO_2$ film than for a nitride film is formed (FIG. 11(D)). Thus, in the etching of the base oxide film 12 when the hole is formed, the side wall 72 becomes the mask and the area of the base oxide film 12 exposed from the side wall 72 is etched. This means there is no danger of excessive etching at the end of the nitride film pattern 16. Also, for example, when the hole diameter in the hole pattern 14 of the nitride film pattern 16 is as small as can be for hole formation using photo lithography, holes with an even smaller diameter can be formed.

Fifth Embodiment

With reference to FIGS. 14, 15 and 16, an example of the formation of the nitride film pattern using a side wall that differs from the fourth embodiment will be explained as a fifth embodiment of the present invention.

FIGS. 14 and 15 provide overviews of the processes involved in the manufacture of the semiconductor devices of this embodiment of the present invention. They provide cross sections taken at positions on the structure during manufacture that have both a hole for the contact between lines and a groove for line.

Figure 16A:
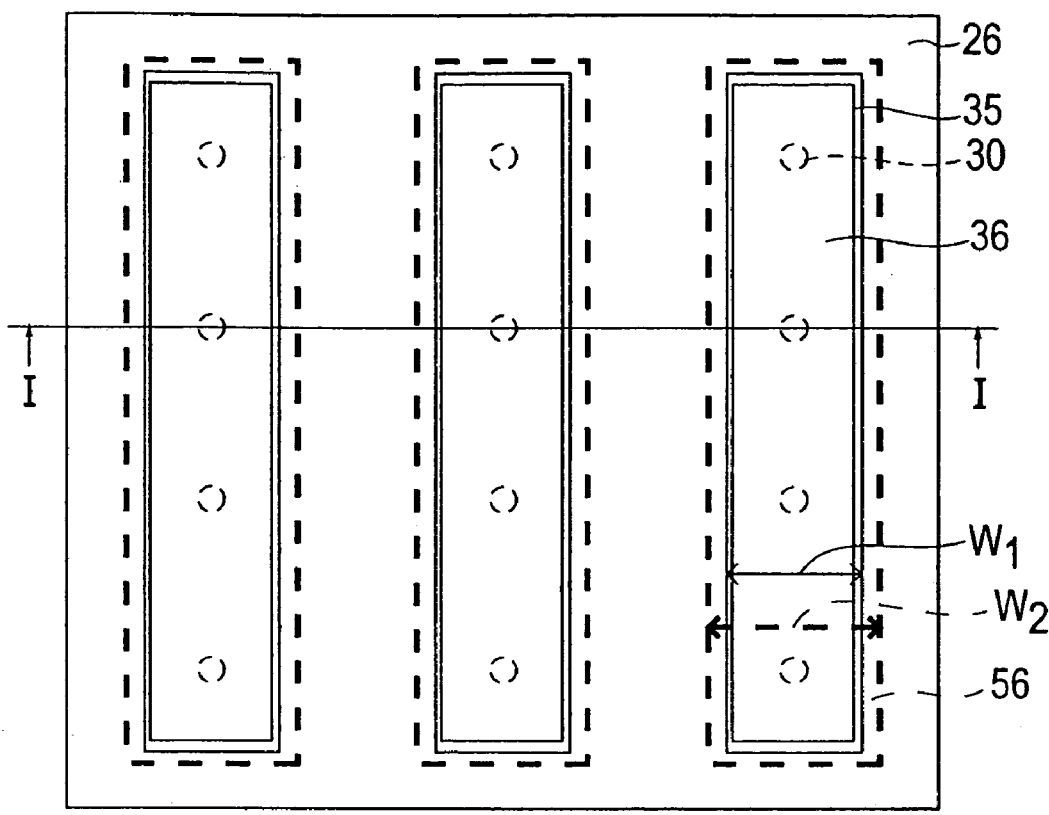
FIGS. 16(A) and 16(B) are a plan view and corresponding cross-sectional view schematically showing the fifth embodiment of a semiconductor device.
Figure 16B:
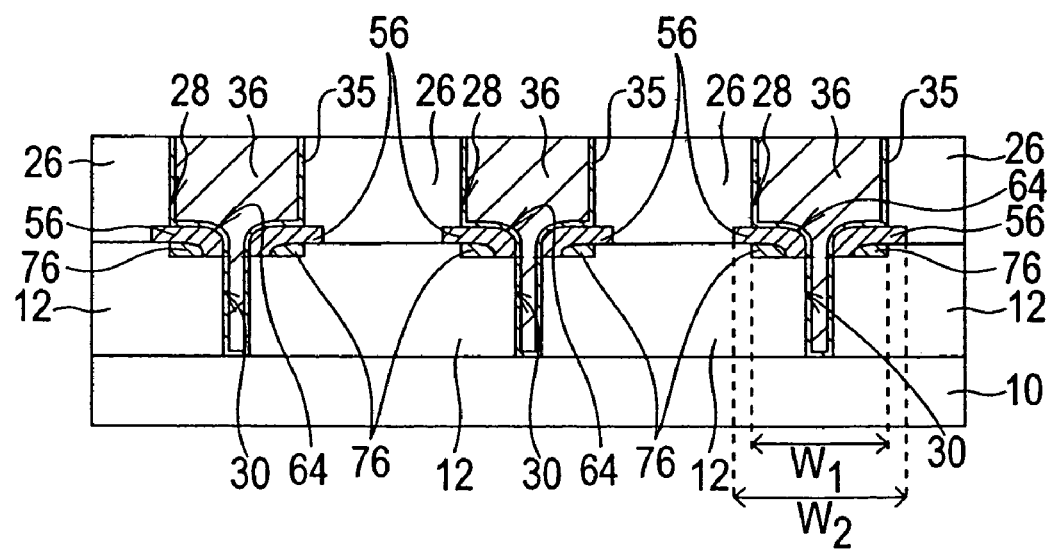

FIGS. 16(A) and 16(B) show a partial plane view of a semiconductor device of the fifth embodiment of the present invention and a cross-sectional view taken along the line I—I of FIG. 16(A), respectively.

Below, those points that differ from the first through fourth embodiments will be explained and detailed explanation of those points that are the same as the first through fourth embodiments will be omitted.

Figure 14A:
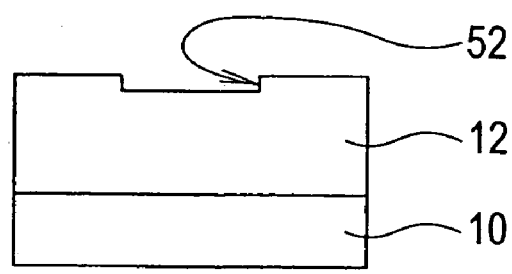
FIGS. 14(A) through 14(D) are general diagrams of the processes involved in the manufacture of a semiconductor device in a fifth embodiment of the present invention, and show cross-sections through the structure.

Firstly, the base oxide film 12 is formed on the substrate 10 (process 5-1) (FIG. 14(A)).

In this example, as with the first through fourth embodiments, the CVD method is used to form an $SiO_2$ film of between 500 and 800 nm in depth on the Si substrate 10.

Next, a groove 52 with an opening shape the same as for the wiring groove formed later is formed (process 5-2) (FIG. 14(A)).

In this example, as in the third embodiment, a groove 52 of the same shape and size (opening diameter) as the wiring groove established later is formed to a depth of between 100 and 300 nm through photo lithography followed by etching (FIG. 14(A)). As in the fourth embodiment, the depth of this groove 52 is determined after consideration of etching controllability and the side wall to be formed later.

Figure 14B:
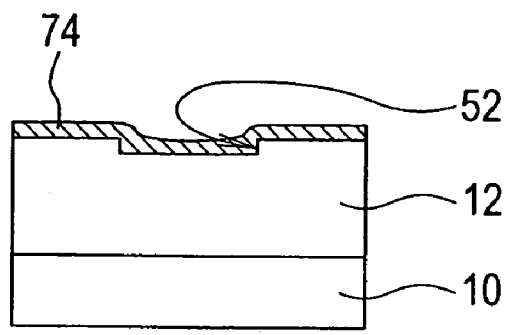

Next, a film 74 for the side wall is formed on the base oxide layer that includes the groove 52 (process 5-2) (FIG. 14(B)).

In this example, the CVD; method is used to form a polysilicon film of between 100 and 300 nm in depth as the side wall film 74 on all the surfaces of the base oxide film 12 including the groove 52 (FIG. 14(B)).

Figure 14C:
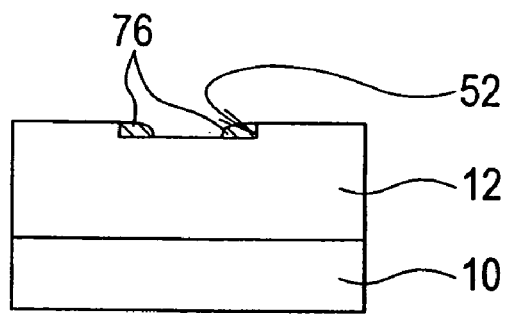

Next, by etching to expose the surface of the base oxide film 12 in the side wall film 74, the side wall 76 is formed on the side wall of the groove 52 (process 5-4) (FIG. 14(C)).

In this example, anisotropic dry etching of the polysilicon film 74 is implemented using $Cl_2$ gas until the surface of the base oxide film 12, not including the groove, and the bottom of the groove 52 are exposed. This causes formation of a polysilicon film side wall 76 on the side walls of the groove 52 (FIG. 14(C)).

Figure 14D:
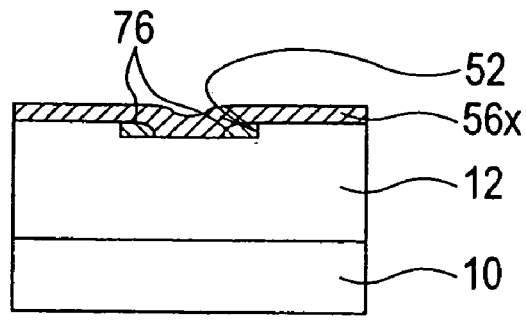

Next, a nitride film pattern 56 with a hole pattern 64 is formed on the side wall 76, in the groove 52 exposed from the side wall 76, and on the base oxide film 12 surrounding this groove (process 5-5) (FIG. 14(D)) through 12(A)).

Here firstly, the CVD method is used to form a nitride film ($Si_3N_4$ film) 56x of between 150 and 300 nm in depth on the groove 52, which includes the side walls 76, and on the base oxide film 12 (FIG. 14(D)). A resist film is then provided on this $Si_3N_4$ film 56x and photo lithography technology is used to form a resist pattern 58 that corresponds to the nitride film pattern. This resist pattern 58 is then used as a mask in the etching of the Si$_3$N$_4$ film 56x. The part of this Si$_3$N$_4$ film 56x that remains after etching forms the nitride film pattern 56. This nitride film pattern 56 is formed within the groove 52 and on the surface of the area of the base oxide film 12 around this groove 52. The nitride film pattern 56 thus obtained comprises a line pattern of a width W2 that is between 0.2 and 1.0 μm larger than the width W1 of the line to be established in a later process, and a hole pattern 64 for contact between lines that is formed within this line pattern (FIG. 15(A)).

Figure 15A:
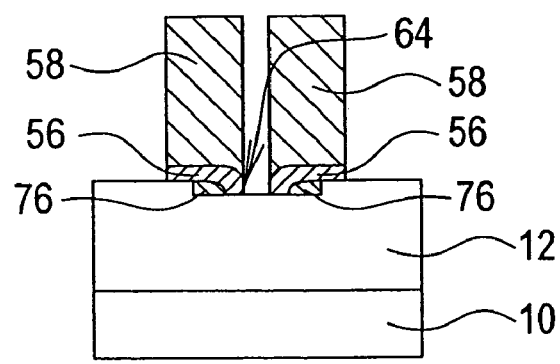
FIGS. 15(A) through 15(D) are also diagrams of the processes involved in the manufacture of a semiconductor device and continue on from FIG. 14.
Figure 15B:
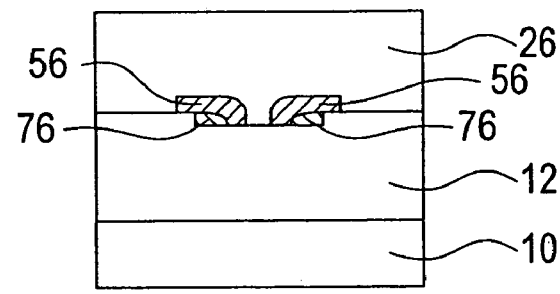

Next, the upper oxide film 26 is formed on the base oxide film 12 that includes the nitride film pattern 56 (process 5-6) (FIG. 15(B)).

In this example, the CVD method is used to form an SiO$_2$ film of between 500 and 800 nm in depth as the upper oxide film 26 on the base oxide film 12 that includes the nitride film pattern 56 (FIG. 15(B)). This upper oxide film 26 is formed using the CVD method.

Figure 15C:
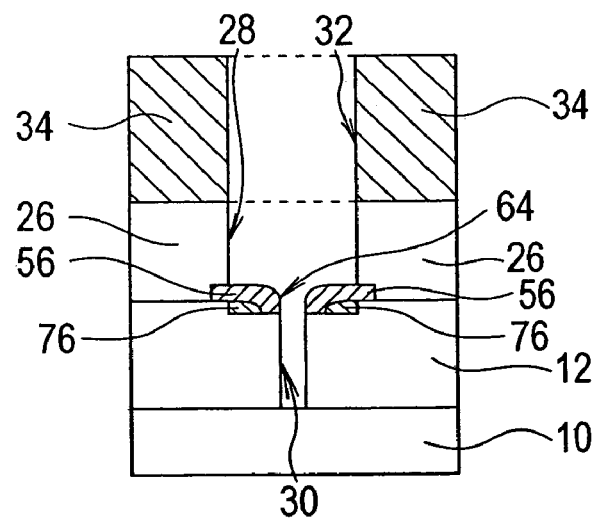

Next, the same etching processing is used to continuously form wiring grooves 28 that penetrate the upper oxide film 26 to expose part of the nitride film pattern 56 that includes the hole pattern 64 and holes 30 that penetrate the base oxide film 12 in the hole pattern 64 to expose part of the substrate 10 (process 5-7) (FIG. 15(C)).

In this example, as in the first through fourth embodiments of the present invention, after the resist film is formed on the upper oxide film 26 it is patterned and a resist pattern 34 with the wiring groove pattern as its window 32 is formed. This resist pattern 34 is then used as a mask in dry etching to firstly form the wiring groove 28 on the upper oxide film 26. Next, the nitride film pattern 56 is used as a mask to etch the base oxide film 12 exposed from the hole pattern 64 until the Si substrate 10 is exposed. Through this process the hole 30 for the contact between lines is formed (FIG. 15(C)).

Figure 15D:
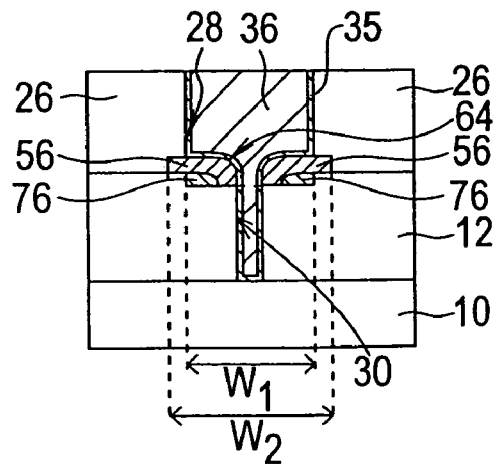

Next, the wiring metal 36 is embedded into the hole 30, on part of the exposed nitride film pattern 56 area, and in the wiring groove 28 (process 5-8) (FIG. 15(D)).

In this example, as in the first through fourth embodiments, after the CVD method is used to form the barrier metal layer 35 in the wiring groove 28 and the hole 30, plating is used to embed Cu as the wiring metal 36 in this wiring groove 28 and hole 30. CMP processing of the part into which Cu 36 is embedded then takes place to flatten the upper oxide film 26 and the exposed Cu 36 surface. The contact between lines and metal lines can then be formed (FIG. 15(D)).

As a result, as in the first through fourth embodiments of the present invention, a nitride film pattern 56 with its width W2 is formed so that it is between 0.2 and 1.0 μm larger than the diameter W1 of the opening of the wiring groove 28 (FIGS. 15(D), 16(A) and 16(B)). This means that in etching to form the wiring groove 28 and hole 30, after etching of the upper oxide film 26 ends, the nitride film pattern 56 acts as an etching mask to protect, as in conventional methods, the base oxide film 12 without exposing any of the base oxide film 12 except within the hole pattern 64.

Also, the nitride film pattern 56 is established only where it is needed on the base oxide film 12, as in this embodiment, and so the pattern can be made smaller than in conventional semiconductor devices. Accordingly, the stress on the nitride film pattern 56 can also be reduced. This enables deformation of formed holes and cracks in the nitride film caused by stress to be avoided.

After the upper oxide film 26 has been formed on the base oxide film 12, which includes the nitride film pattern 56, the wiring groove 28 is formed through the upper oxide film 26 and, at the same time, etching to form the hole 30 for contact between lines on the base oxide film 12 is implemented. At this time the resist pattern 34 that corresponds to the shape of the wiring groove is formed on the upper oxide film 26. Even if a slight discrepancy in the position of the resist pattern 34 emerges, the side wall 76 lies beneath the part of the nitride film pattern 56 exposed from the formed wiring groove 28 and therefore the film is thick here. Thus, as is preferable, the area of the base oxide film 12 positioned beneath the nitride film pattern 56 can be protected.

Sixth Embodiment

With reference to FIGS. 17, 18 and 19, a modified example of the first embodiment will be explained as a sixth embodiment of the present invention.

Figure 19A:
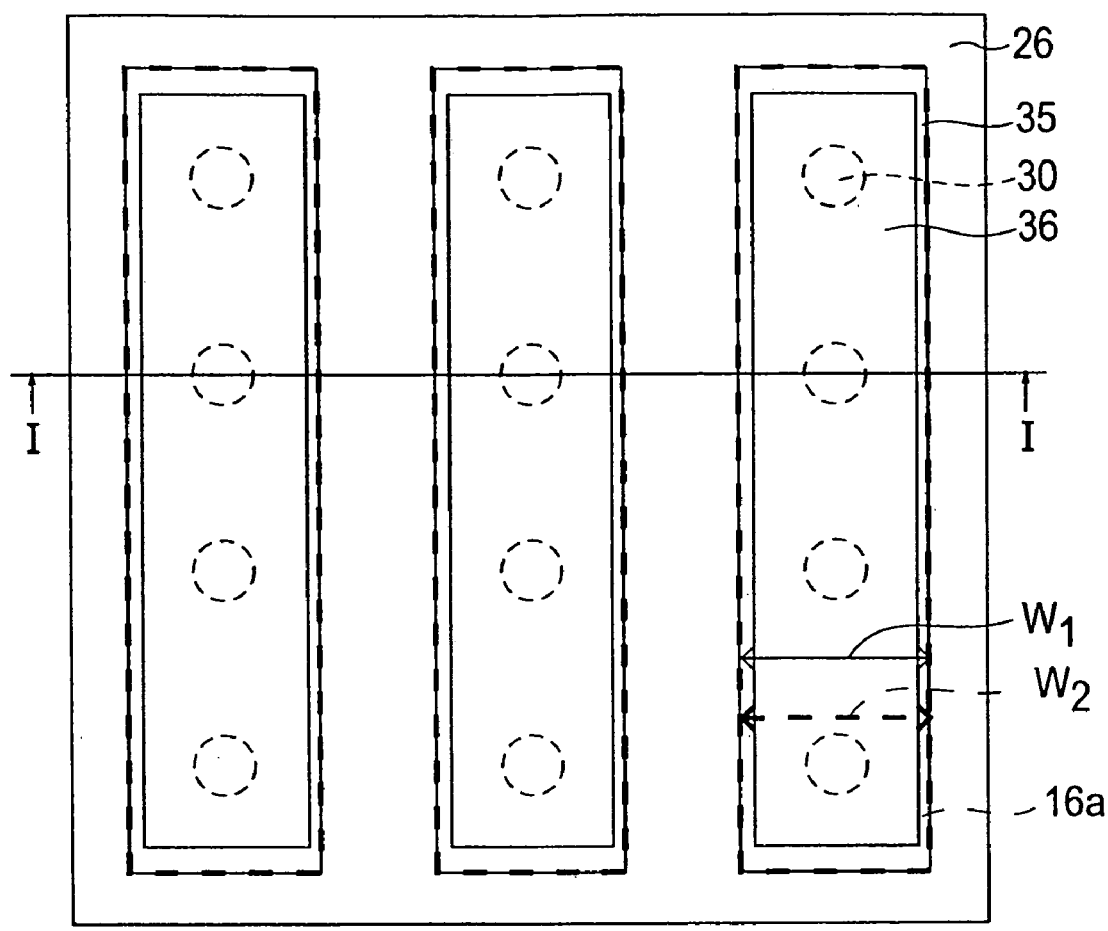
FIGS. 19(A) and 19(B) are a plan view and corresponding cross-sectional view schematically showing the sixth embodiment of a semiconductor device.
Figure 19B:
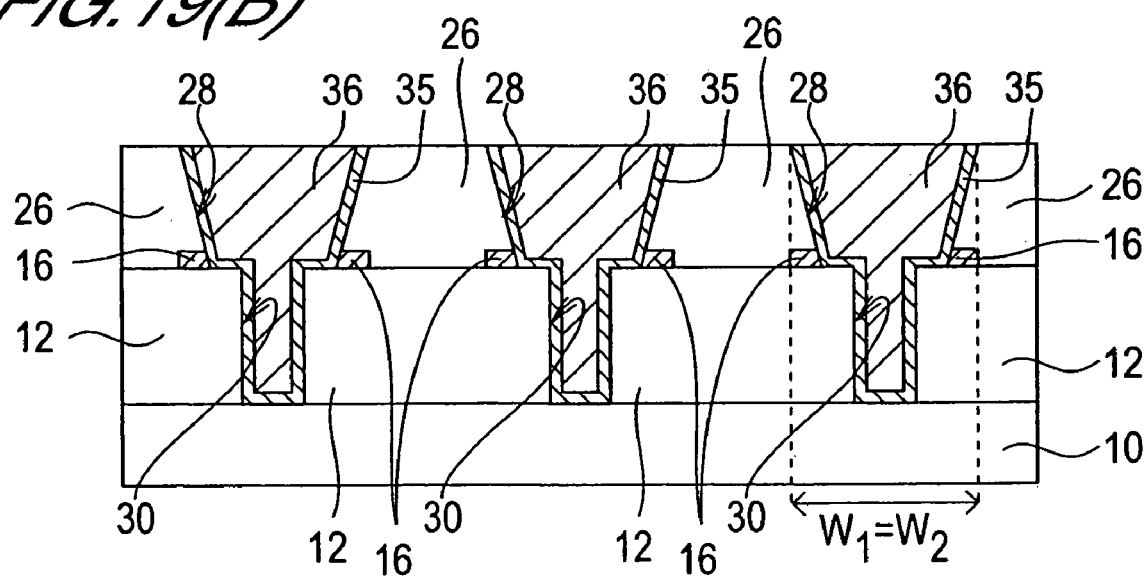
Figure 20:
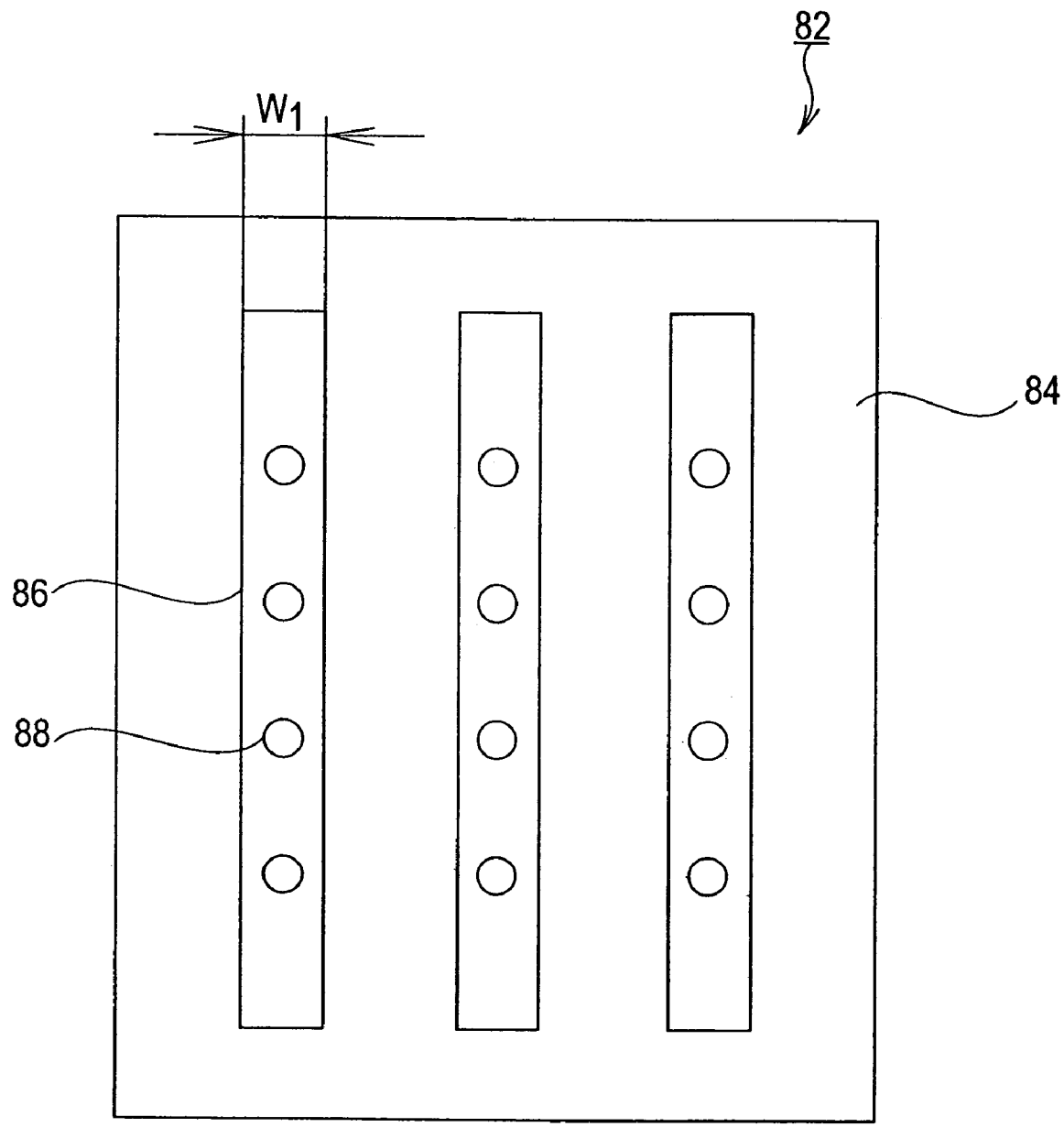
FIG. 20 is a general schematic view of the mask used in photo lithography.

FIGS. 17 and 18 provide overviews of the processes involved in the manufacture of the semiconductor devices of this embodiment of the present invention. They provide cross sections taken at positions on the structure during manufacture that have both a hole for the contact between lines and a groove for line. FIGS. 19(A) and 19(B) show a partial plan view of a semiconductor device of the sixth embodiment of the present invention and a cross-sectional view taken along the line I—I of FIG. 19(A), respectively. FIG. 20 is a general schematic view of the mask used in photo lithography.

Below, those points that differ from the first through fifth embodiments will be explained and detailed explanation of those points that are the same as the first through fifth embodiments will be omitted.

Figure 17A:
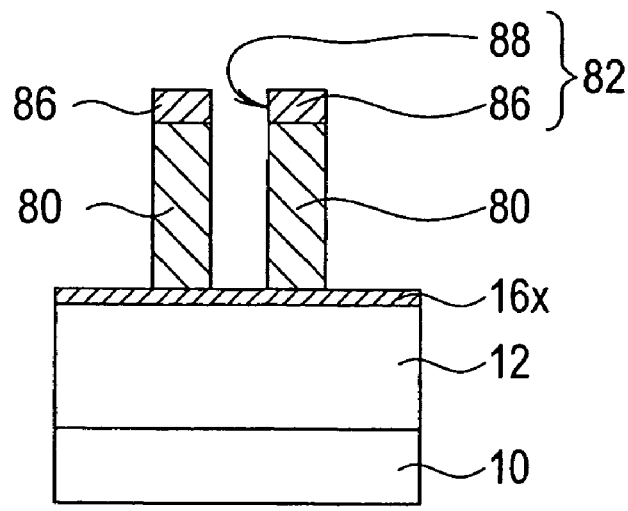
FIGS. 17(A) through 17(C) are general diagrams of the processes involved in the manufacture of a semiconductor device in a sixth embodiment of the present invention, and show cross-sections through the structure.

Firstly, as in the first embodiment of the present invention, the base oxide film 12 is formed on the substrate 10 (same as process 1-1) (FIG. 17(A)). In this example, the CVD method is used to form a SiO$_2$ film of between 500 and 800 nm in depth as the base oxide film 12 on the Si substrate.

Figure 17B:
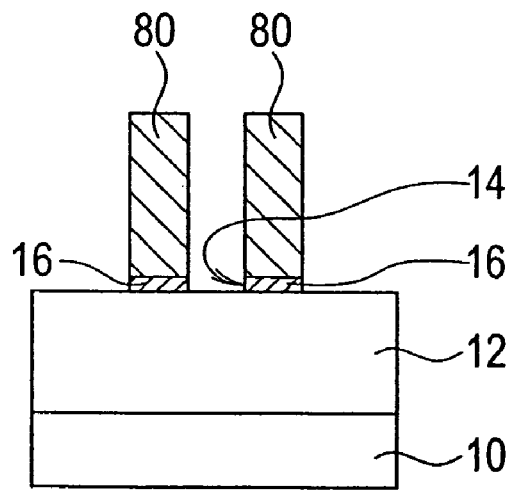

Next, a nitride film pattern 16 with a hole pattern 14 is formed on the base oxide film 12 (similar to process 1-2) (FIGS. 17(A) and 17(B)).

In this example, firstly the CVD method is used to form an Si$_3$N$_4$ film of 50 nm in depth as the nitride film 16x on the SiO$_2$ film 12. A resist film is then provided on the Si$_3$N$_4$ film 16x and using ordinary photo lithography technology, a resist pattern 80 is formed to correspond to the nitride film pattern (FIG. 17(A)).

The configuration of the mask 82 used in this photo lithography is shown in FIG. 20. This mask 82 comprises a transparent mask substrate 84, a line pattern 86 of a width that is, in practice, the same as the width W1 of the line to be made later, and a hole pattern 88 for the contact between lines. There is a plurality of line patterns 86 and these patterns run parallel to one another. There are also as many hole patterns 88 as required. In this example, the line width W1 is between 0.25 and 1.0 μm and the hole diameter is between 0.1 and 0.5 μm. The hole diameter is designed so that it is never larger than the line width W1.

In this example, etching of the resist film with this mask 82 is used to form the resist pattern 80 that corresponds to the shape of the nitride film pattern (FIG. 17(A)). Then, by etching the Si$_3$N$_4$ film 16x using this resist pattern 80 as the mask, the nitride film pattern 16 is formed with the same size and shape as the wiring groove width W1 and with the hole pattern 14 (FIG. 17(B)).

Figure 17C:
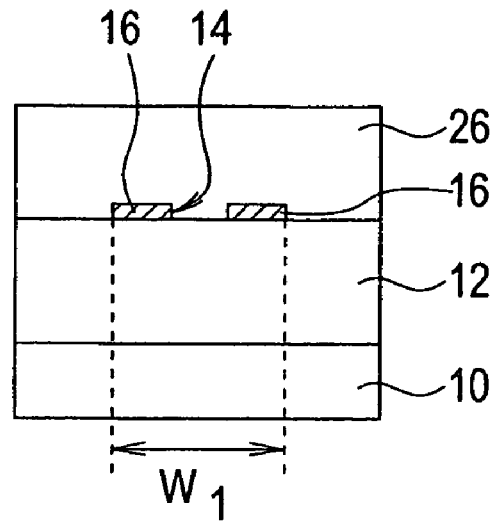

Next, the upper oxide film 26 is formed on the base oxide film 12 to cover the nitride film pattern 16 (same as process 1-3) (FIG. 17(C)).

In this example, the CVD method is used to form an $SiO_2$ film of between 500 and 800 nm in depth as the upper oxide film 26 on the base oxide film 12 (FIG. 17(C)).

Figure 18A:
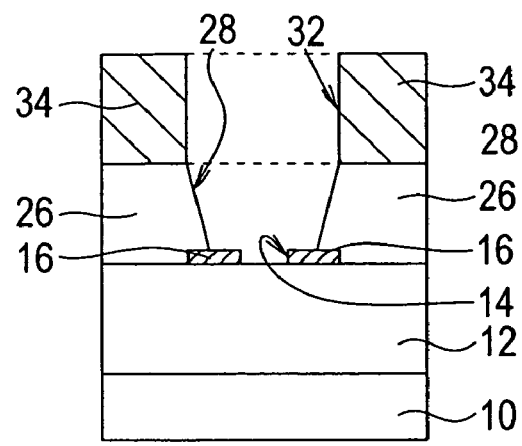
FIGS. 18(A) through 18(D) are also diagrams of the processes involved in the manufacture of a semiconductor device and continue on from FIG. 17.
Figure 18B:
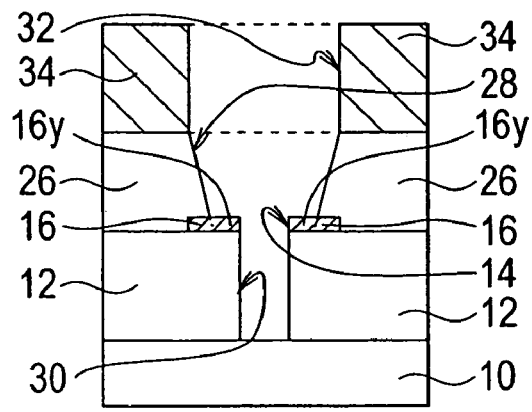
Figure 18C:
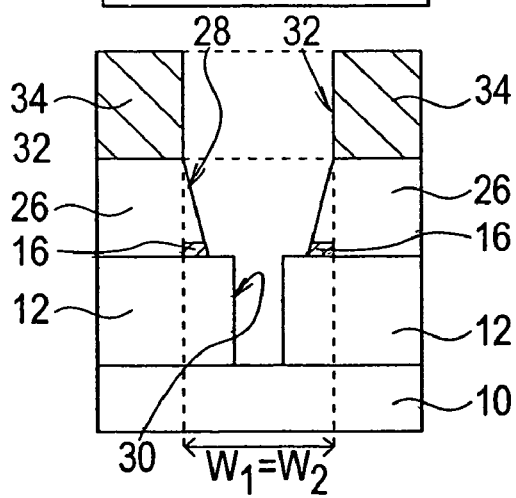

Next, the same etching processing is used to continuously form wiring grooves 28 that penetrate the upper oxide film 26 to expose the nitride film pattern 16 and, using the nitride film pattern 16 as a mask, holes 30 that penetrate the base oxide film 12 to expose part of the substrate 10 (modification of process 1-4) (FIGS. 18(A) and 18(B)).

In this embodiment, after the resist film has been formed on the upper oxide film ($SiO_2$ film) 26 it is patterned to form a resist pattern 34 in which the wiring groove pattern becomes the window 32. Next, the resist pattern 34 is used as a mask in dry etching that uses a reaction gas incorporating $CH_2F_2$ gas. Here, the upper oxide film 26 exposed from the window 32 is etched using a gas in which $C_4F_8$, $O_2$, Ar, and $CH_2F_2$ are incorporated with flow rates of 20, 6, 400, and 10 sccm respectively. Etching of the upper oxide film 26 ends when the surface of the nitride film pattern 16 that lies between the upper oxide film 26 and the base oxide film 12 is exposed. When $CH_2F_2$ is incorporated in the reaction gas, the reaction product adheres to everything from the internal wall surface of the wiring groove formed by etching to the nitride film pattern 16 on the bottom of the groove. This causes tapering of the internal wall surface of the wiring groove 28 formed (FIG. 18(A)). The nitride film pattern 16 that is exposed from the bottom of the opening of the upper oxide film 26 is then used as a mask in etching the base oxide film 12 that is exposed from the hole pattern 14. The reaction product produced through etching the upper oxide film 26 adheres to the nitride film pattern 16 (not shown in any figure) and this acts as a protective film. Accordingly, the nitride film pattern 16 is not as thick (50 nm) as normal (150 to 300 nm) but is adequate for use as a mask in forming the above protective film. The etching of the base oxide film 12 ends when the surface of the Si substrate 10 is exposed from the hole pattern 14. This causes formation of the wiring groove 28 and hole 30 (FIG. 18(B)).

Next, the portion of the nitride film pattern 16 exposed in the wiring groove 28 is etched and removed. In this embodiment of the present invention, a combination or mixture of $CHF_3$ and $CF_4$ is used as the etching gas. So that the base oxide film 12 below is not etched, etching is implemented so that the nitride etching selection ratio is high for the oxide film. Accordingly, a $CHF_3$ rich mix, that is a mix with a $CHF_3$:$CF_4$ ratio of 3:1 (flow rate ratio) is used. Through the use of such conditions it is possible to ensure a nitride film etching selection ratio of approximately 5 for the oxide film. This enables removal of the portion 16y of the nitride film pattern 16 exposed from the wiring groove 28 (FIG. 18(C)).

Figure 18D:
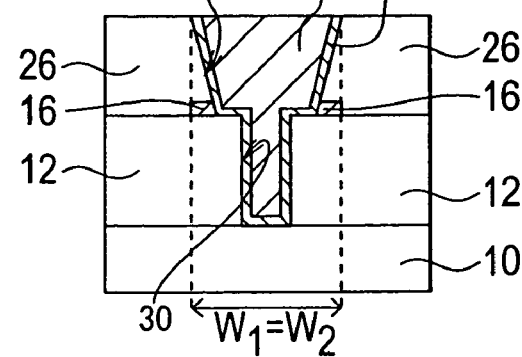

Next, the wiring metal 36 is embedded into the hole 30 and wiring groove 28 (same as process 1-5: dual damascene process) (FIG. 18(D)).

In this example, for example after the CVD method is used to form a 50 nm barrier metal layer 35 in the hole 30 and groove 28, plating is used to embed Cu 36 in the hole 30 and wiring groove 28. When the hole 30 has been filled by the barrier metal layer 35, Cu 36 can be embedded just in the wiring groove 28 in which case the spatter method can be used. Also, in this example, Cu has been used as the wiring metal 36 to reduce the line capacity but the lines and contacts between lines can also be made using an Al alloy as the metal.

CMP processing of the part in which the Cu 36 is embedded is then implemented to enable formation of the contact between lines and the metal lines (FIG. 18(D)).

As a result, as is clear from the above explanations, the nitride film pattern 16 with its width W2 is formed so that it is of the same size as the opening of the wiring groove 28 and so that it is thinner than usual (FIGS. 18(D), 19(A) and 19(B)). Also, in the etching to form the wiring groove 28 and hole 30, a gas incorporating $CH_2F_2$ is used. Thus, the wiring groove 28 is tapered after its formation. After etching of the upper oxide film 26 ends, the nitride film pattern acts as an etching mask to protect the base oxide film 12 so that none of this base oxide film 12 is exposed except within the hole pattern 14.

Also, the nitride film pattern 16 is established only where it is needed on the base oxide film 12 and so the pattern can be made smaller than in conventional semiconductor devices. In addition, it is not as thick as the film used in conventional methods. Accordingly, the stress on the nitride film pattern 16 can also be reduced. This enables deformation of formed holes cracks in the nitride film caused by stress to be avoided.

In this embodiment, a mixture of $C_4F_8$, $O_2$, Ar, and $CH_2F_2$ is used as the reaction gas in etching to form the wiring grooves and holes. However, a gas in which $CH_2F_2$ is mixed with three or four of $C_4F_8$, $O_2$, Ar, and CO can also be used. For example, combinations such as $C_4F_8$, $O_2$, Ar, CO and $CH_xF_2$ or $C_4F_8$, Ar, CO and $CH_2F_2$ are possible.

Also, in this embodiment, a combination of $CHF_3$ and $CF_4$ gas has been used in etching to remove the nitride film pattern exposed from the wiring groove. However, as a fluorine gas, $SF_6$ can also be used. To increase the nitride film etching selection ratio for the oxide film, the amount of the $O_2$ gas added to the etching gas can be reduced.

The process to remove the portion 16y of the nitride film pattern 16 exposed from the wiring groove 28 is only implemented in this embodiment of the present invention but can also be applied in the first through fifth embodiments.

Seventh Embodiment

The seventh embodiment of the present invention is an example of a modification to the sixth embodiment. An example of modifications to the first embodiment will be explained with reference to FIG. 21.

FIG. 21 provides an overview of the processes involved in the manufacture of the semiconductor devices of this embodiment of the present invention. It provides cross sections taken at positions on the structure during manufacture that have both a hole for the contact between lines and a groove for line.

Figure 22A:
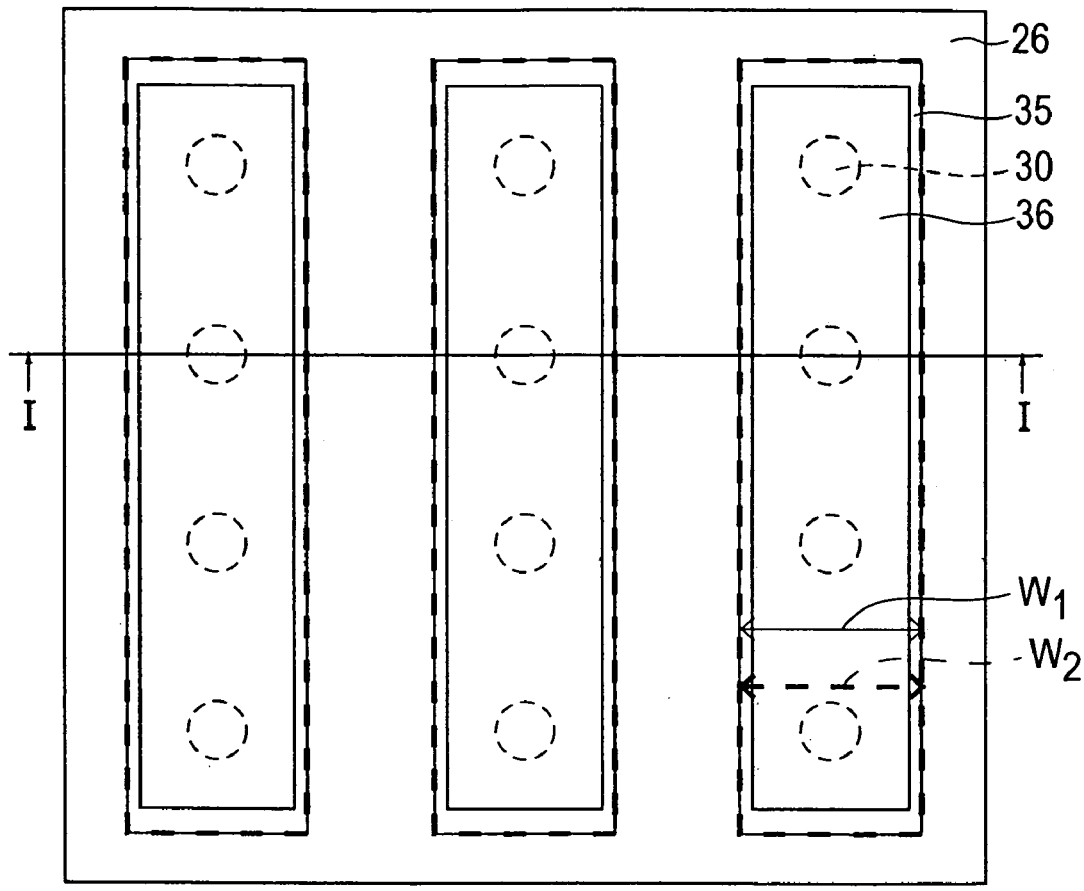
FIGS. 22(A) and 22(B) are a plan view and corresponding cross-sectional view schematically showing the seventh embodiment of a semiconductor device.
Figure 22B:
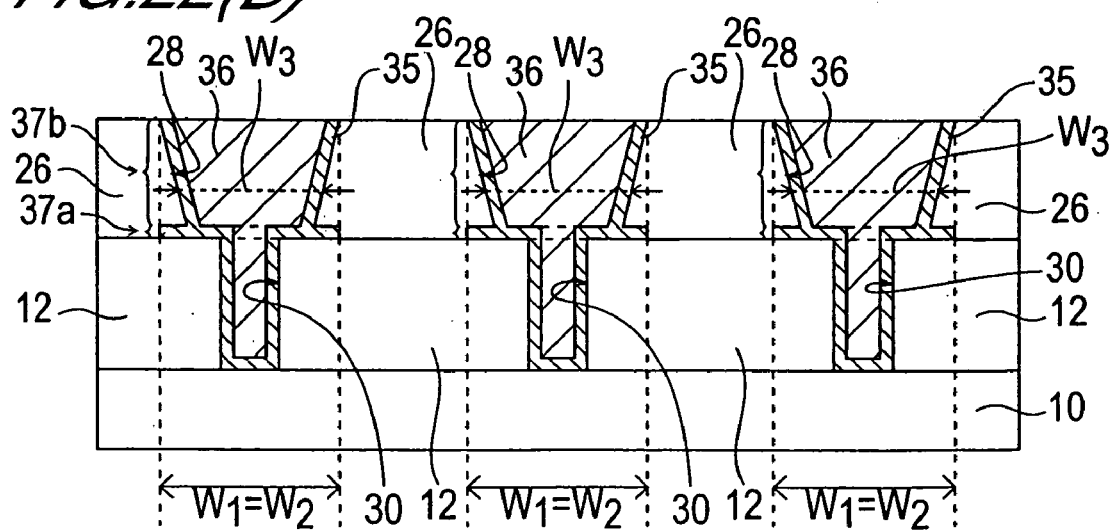

FIGS. 22(A) and 22(B) show a partial plane view of a semiconductor device of the seventh embodiment of the present invention and a cross-sectional view taken along the line I—I of FIG. 22(A), respectively.

Below, those points that differ from the sixth embodiment will be explained and detailed explanation of those points that are the same will be omitted.

Firstly, as in the sixth embodiment of the present invention, after the base oxide film 12 is formed on the substrate 10, a nitride film pattern 16 with a hole pattern 14 is formed on the base oxide film 12 (refer to FIGS. 17(A) and 17(B)). An upper oxide film 26 is then formed on the base oxide film 12 to cover the nitride film pattern 16 (refer to FIG. 17(C)). Next, the same etching processing is used to continuously form wiring grooves 28 that penetrate the upper oxide film 26 to expose the nitride film pattern 16 and holes 30 that penetrate the base oxide film 12 to expose part of the substrate 10 using the nitride film pattern 16 as a mask (refer to FIGS. 18(A) and 18(B)).

Next, the part of the nitride film pattern 16 that is exposed in the wiring groove is etched and removed. In this embodiment, wet etching is used here. Wet etching is implemented with a high nitride film etching selection ratio for the oxide film. In this example, $H_3PO_4$ is used as the etchant.

Firstly, the $H_3PO_4$ is placed inside the etching tank in which wet etching will take place and then heated to 160° C. Next, the structure as shown in FIG. 18(B) is immersed in the $H_3PO_4$ in the etching tank. In this example, the thickness of the nitride film pattern is 50 nm. The nitride film etching rate achieved by the $H_3PO_4$ is approximately 60 nm per minute. This means that the immersion time is approximately one minute. The structure is then washed in pure water and dried.

Figure 21A:
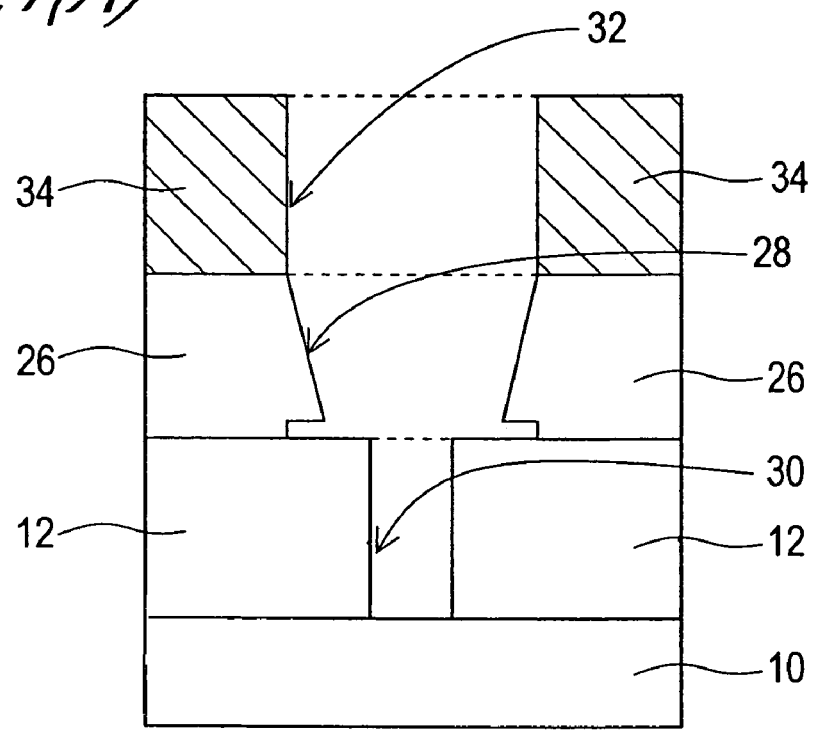
FIGS. 21(A) and 21(B) are general diagrams of the processes involved in the manufacture of a semiconductor device in a seventh embodiment of the present invention, and show cross-sections through the structure.

This process enables removal of almost all the nitride film pattern 16 that lies between the base oxide film 12 and the upper oxide film 26 (FIG. 21(A)).

Next, as in the sixth embodiment, the wiring metal 36 is embedded in the hole 30 and wiring groove. Firstly, after the CVD method is used to form the barrier metal layer 35 in the hole 30 and wiring groove 28, plating is used to embed Cu 36 in the hole 30 and wiring groove 28. By implementing CMP processing from the top of the upper oxide film 26 until its upper surface is exposed, the contacts between lines and metal lines can be formed (FIG. 21(B)).

Figure 21B:
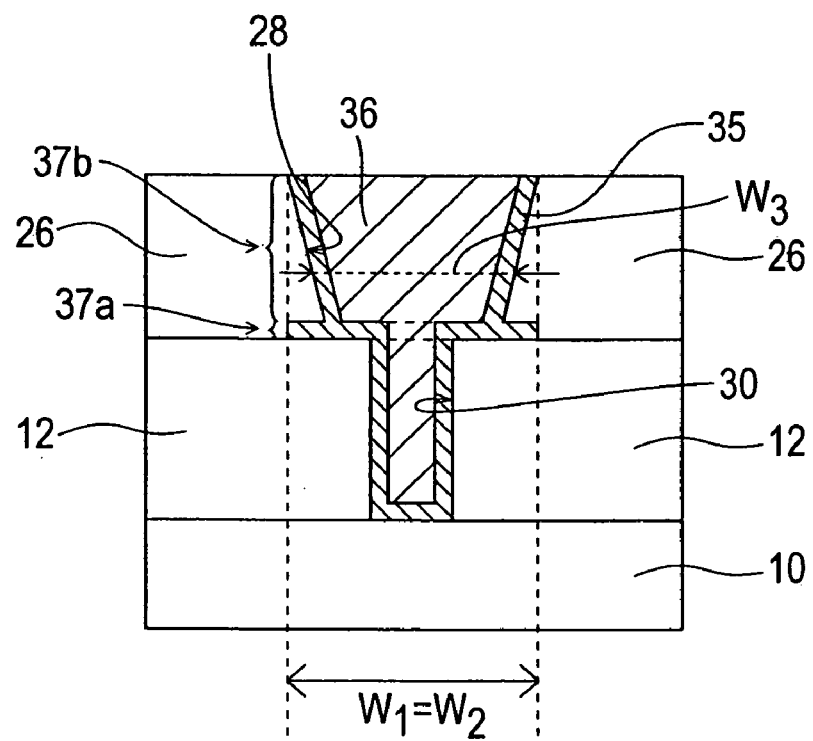

Accordingly, as shown in FIGS. 21(B), 22(A) and 22(B), barrier and wiring metal (35, 36) that fills each of the holes (30) and each of the wiring grooves (28), the barrier and wiring metal (35, 36) having first portions (37a) on the base oxide film (12) and second portions (37b) at a middle section of the upper oxide film (26) above the first portions (37a), and each of the first portions (37a) having a width w1 smaller than a width w3 of each of the second portions (37b).

As a result, the nitride film is removed from the structure after the line is formed. This configuration allows deformation of the holes formed and cracks in the nitride film caused by stress placed on the nitride film to be avoided. It also enables a large reduction in the line capacity as there is no interference by the nitride film.

In this embodiment of the present invention, the etchant used in removing the nitride film pattern 16 that is exposed from the wiring groove 28 is $H_3PO_4$. However, this is not the only etchant that can be used. Any other etchant that can ensure that the nitride film etching selection rate is high for the oxide film can be used.

Also, the process to remove the nitride film pattern 16 that is exposed from the wiring groove 28 using wet etching is only implemented in this embodiment but it can also be applied to the first through fifth embodiments.

Eighth Embodiment

An example of a semiconductor device configured so that a base wiring area is formed on the upper surface of a underlayer of the semiconductor device formed in the first through seventh embodiments of the present invention will be explained as an eighth embodiment.

FIG. 23 is a general diagram of the processing that relates to substrate until before the base oxide film is formed on a underlayer. The diagram provides cross sectional views.

In this embodiment, a base wiring area 90 is formed on the upper surface 10a of the substrate 10 as an underlayer. This base wiring area 90 is provided with a barrier metal 92 on the inside wall of the contact hole 91 provided on the substrate 10. Cu, the wiring metal 94, is formed so that it fills the contact hole 91 on this barrier metal 92. In this example, the thickness of the wiring metal 94 is between 500 and 600 nm (FIG. 23(A)).

A dispersion prevention film 95 is formed across the entire upper surface 10a of this substrate 10. In this example, the dispersion prevention film is a silicon nitride film. The CVD method is used to form a film to a depth of between 30 and 50 nm (FIG. 23(B)).

Next, this dispersion prevention film 95 is patterned until dispersion prevention film 95x only remains on the base wiring area 90 of the substrate 10.

Figure 23A:
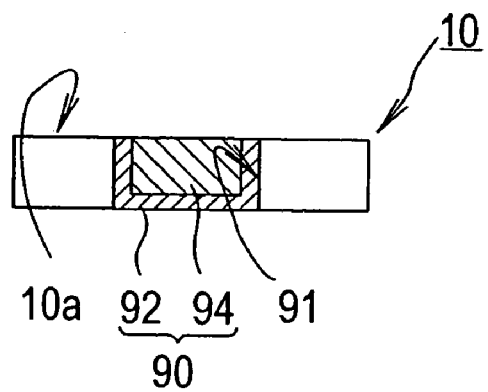
FIGS. 23(A) through 23(D) are general diagrams of the processes involved in the manufacture of a semiconductor device in an eighth embodiment of the present invention, and show cross-sections through the structure.
Figure 23B:
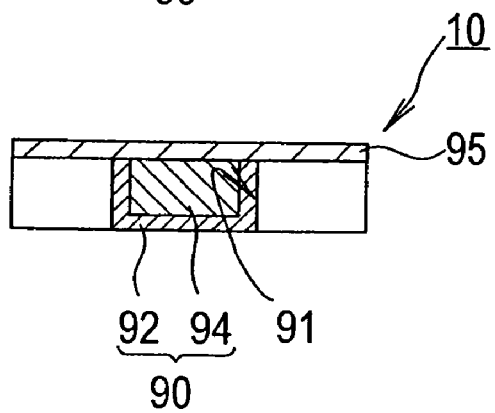
Figure 23C:
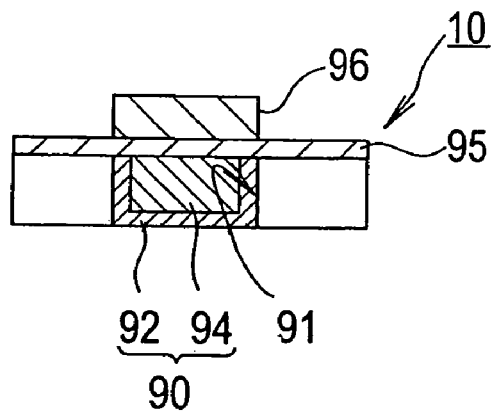

In this embodiment, after a resist pattern 96 is formed on the dispersion prevention film 95 to cover the base wiring area 90 (FIG. 23(C)), the resist pattern 96 is used as a mask in anisotropic dry etching to remove the dispersion prevention film 95. An etching gas such as a mixture of $CHF_3$ and CO is used.

Figure 23D:
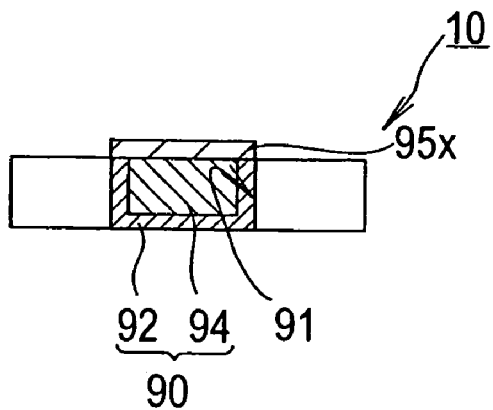
Figure 24A:
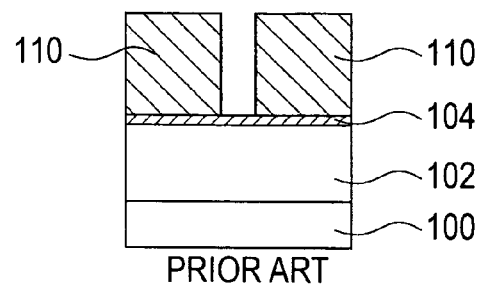
FIGS. 24(A) through 24(E) are diagrams showing the processes involved in the manufacture of conventional semiconductors.
Figure 24B:
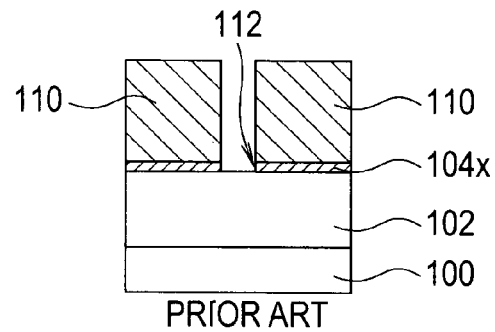
Figure 24C:
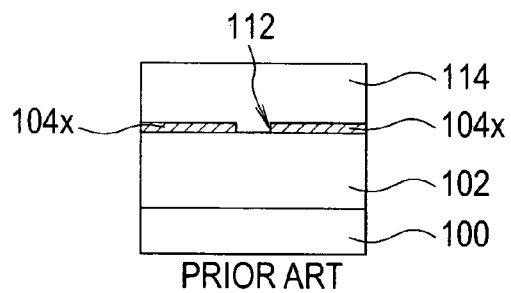
Figure 24D:
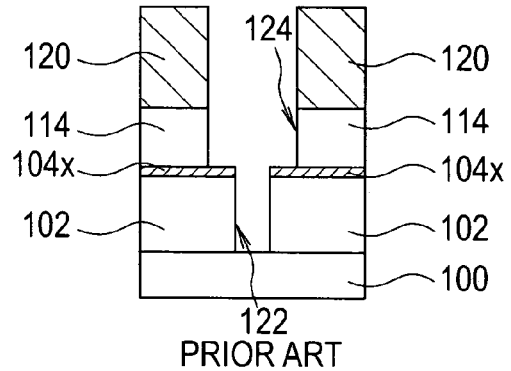
Figure 24E:
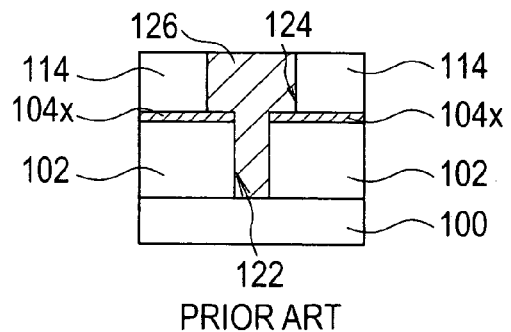
Figure 25:
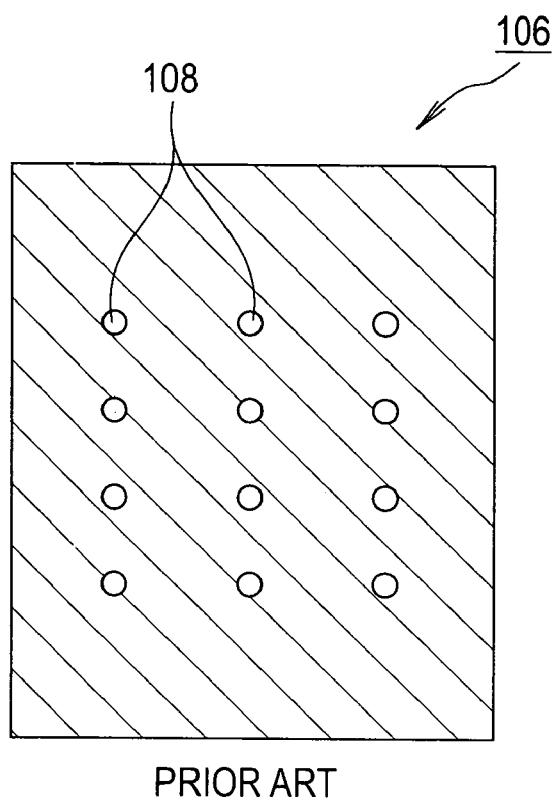
FIG. 25 is a plan view of the mask used in hole formation that is used to explain the conventional art.
Figure 26:
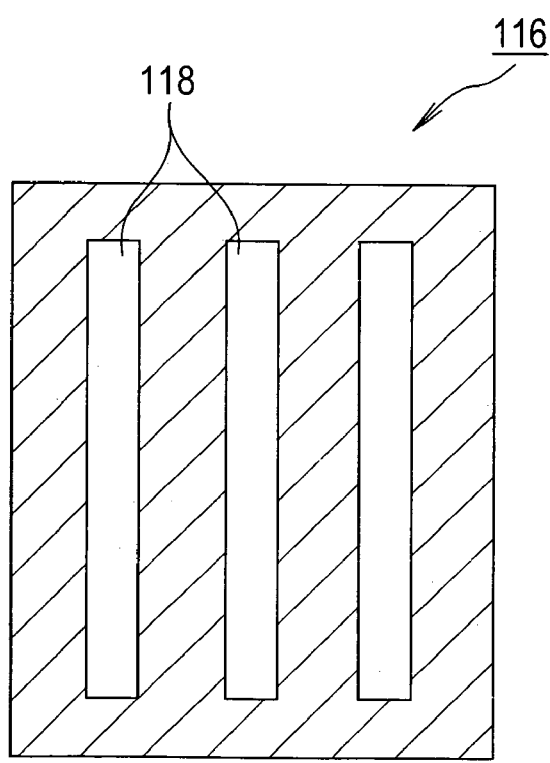
FIG. 26 is a plan view of the mask used in line pattern formation that is used to explain the conventional art.
Figure 27:
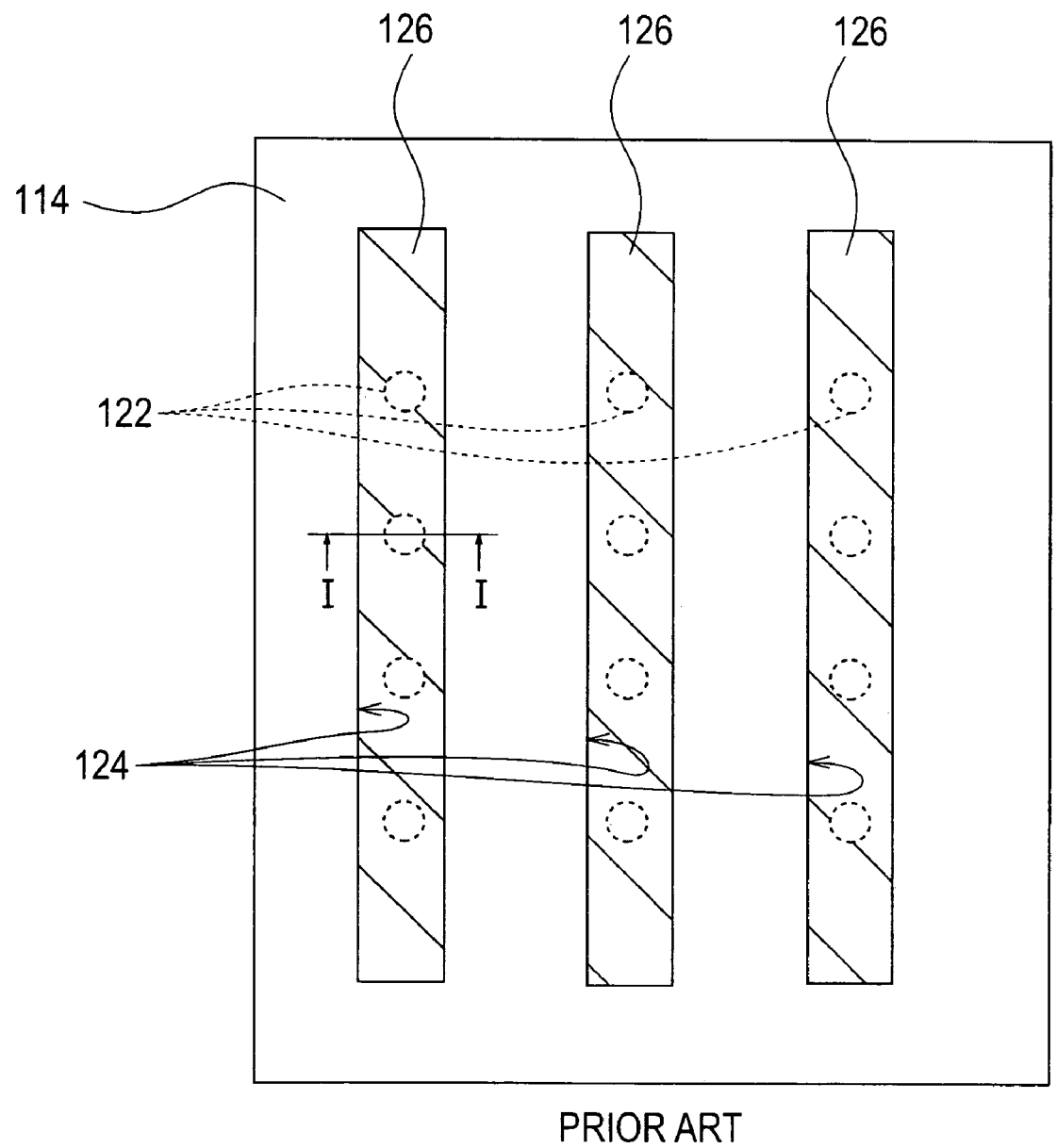
FIG. 27 is a plan view of a conventional semiconductor device as viewed from above.

Then, removal of the resist pattern 96 achieves a substrate 10 with dispersion prevention film 95x only on the base wiring area 90 (FIG. 23(D)).

As explained for the first through seventh embodiments for the present invention, a base oxide film is formed on the substrate 10 that includes the dispersion prevention film 95.

On the upper surface 10a of the substrate 10 on which the base wiring area 90 is formed as in this embodiment, the dispersion prevention film 95x is only provided over the base wiring area 90. Therefore, the capacity between the substrate 10 and the base oxide film provided above it can be minimized. Thus, by combining this embodiment with any of the first through seventh embodiments, the overall line capacity of the semiconductor device can be reduced. Also, the effects of stress on the nitride film can be greatly reduced compared to conventional methods.

As made clear in the above explanations, the semiconductor device of the present invention is provided with a underlayer, a base oxide film formed on top of this underlayer, a nitride film pattern with a hole pattern that is provided on top of this base oxide film, a hole that penetrates the above base oxide film, an upper oxide film provided on the base oxide film to cover the nitride film pattern, a wiring groove in which part of the nitride film pattern placed on the upper oxide film and including a hole pattern is exposed, and wiring metal that fills the holes and wiring groove. The above nitride film pattern is formed to be of a shape and size that enables it to enclose the outside of the wiring groove. This nitride film pattern does not touch any neighbouring nitride film pattern.

Therefore, the size of the nitride film pattern can be smaller than in conventional semiconductor devices and the stress on the nitride film reduced. This produces a semiconductor device with low interconnection capacity.

Also, methods for manufacturing semiconductor devices with small nitride film patterns than in conventional devices include the following processes: a process to form a base oxide film on the substrate (1-1); a process to form a nitride film pattern with a hole pattern on the base oxide film (1-2); a process to form an upper oxide film on the base oxide film to cover the nitride film pattern (1-3); a process where the same etching is used to form, one after another, the wiring groove that penetrates the upper oxide film to expose the nitride film pattern, and the hole that, when the nitride film pattern is used as a mask, penetrates the base oxide film to expose part of the substrate (1-4); and a process to fill the hole, part of the exposed nitride film pattern, and the wiring groove with the wiring metal (1-5).

In the above process (1-2), a nitride pattern of a shape and size that encloses the outside of the wiring groove is formed.

When wiring grooves and holes are continuously formed (process 1-4), this nitride film pattern is used as a mask to form holes with openings that are smaller than that of the wiring groove. That is, the nitride film pattern is a mask that covers the upper surface of the base oxide film except for where holes will be formed. Here, the nitride film pattern should cover the area other than where holes will be formed on the base oxide film that has been exposed from the wiring groove. Accordingly, by forming a nitride film pattern, which is easily subject to stress, over a minimized area, the stress can be reduced. Therefore, deformation of formed holes and cracks in the nitride film caused by stress can be avoided.

What is claimed is:

1. A semiconductor device manufacturing method, comprising the steps of:
   forming a base oxide film on an underlayer;
   forming a groove for nitride film pattern formation by etching the surface area of the base oxide film;
   filling the groove for nitride film pattern formation with nitride film material and forming a nitride film pattern with a hole pattern;
   forming an upper oxide film on said base oxide film that includes the nitride film pattern;
   forming wiring grooves to expose part of said nitride film pattern including said hole pattern through the upper oxide film and subsequently forming holes to expose part of said underlayer through said base oxide film within the hole pattern, both by the use of etching processing; and
   filling said holes, part of the exposed nitride film pattern, and said wiring grooves with wiring metal.

2. A semiconductor device manufacturing method according to claim 1, wherein a profile of said nitride film pattern is formed with such a shape and size that surrounds said wiring groove with a gap from 0.2 and 1.0 $\mu$m.

3. A semiconductor device manufacturing method, comprising the steps of:
   forming a base oxide film on an underlayer;
   forming a groove by etching the surface area of the base oxide film;
   forming a nitride film on the base oxide film including the grooves;
   etching the nitride film to form a nitride film pattern having a hole pattern substantially at the center of said groove, with such a shape and size that surrounds the outside of said groove;
   forming an upper oxide film on said base oxide film and the nitride film pattern thereon;
   forming wiring grooves to expose part of said nitride film pattern including said hole pattern through the upper oxide film and subsequently forming holes to expose part of said underlayer through said base oxide film within the hole pattern, both by the use of etching processing; and
   filling said holes, part of exposed nitride film pattern area, and said wiring grooves with wiring metal.

4. A semiconductor device manufacturing method comprising the steps of:
   forming a base oxide film on a underlayer;
   forming a nitride film pattern with a hole pattern on the base oxide film over an area that surrounds the outside of wiring grooves to be formed later;
   forming a side wall formation groove at least on base oxide film exposed from said hole pattern by etching the area of said base oxide film exposed from said nitride film pattern while using the nitride film pattern as a mask;
   forming a side wall film within said side wall formation groove and on said nitride film pattern;
   forming side walls on side walls of said side wall formation groove by etching the side wall film to exposes the surface of said nitride film pattern;
   forming upper oxide film on the side walls, on the base oxide film exposed from the side walls, and on said nitride film pattern;
   forming wiring grooves to expose part of said nitride film pattern including said hole pattern through the upper oxide film and subsequently forming holes to expose part of said underlayer through said base oxide film within the hole pattern, both by the use of etching processing; and
   filling said holes, exposed side walls, part of the exposed nitride film pattern, and said wiring grooves with wiring metal.

5. A semiconductor device manufacturing method comprising the steps of:
   forming a base oxide film on a underlayer;
   forming a groove on the base oxide film with an opening that is shaped in the same way as the wiring groove to be formed later;
   forming a side wall film on the base oxide film, including the groove;
   forming a side wall on the sides of the groove by etching said side wall film to expose the surface of said base oxide film;
   forming a nitride film pattern with a hole pattern on the side walls, in the groove exposed from the side walls, and on the area of said base oxide film around the grooves;
   forming an upper oxide film on said base oxide film including the nitride film pattern;
   forming wiring grooves to expose part of said nitride film pattern including said hole pattern through the upper oxide film and subsequently forming holes to expose part of said underlayer through said base oxide film within the hole pattern, both by the use of etching processing; and
   filling said holes, part of exposed nitride film pattern, and said wiring grooves with wiring metal.

6. A semiconductor device manufacturing method comprising the steps of:
   forming a dispersion prevention film on top of an underlayer;
   patterning the dispersion prevention film so that it remains only on a base wiling area of said underlayer
   forming a base oxide film on said underlayer;
   forming a nitride film pattern with hole pattern on the base oxide film;
   forming an upper oxide film on said base oxide film to cover the nitride film pattern;
   forming wiring grooves to expose part of said nitride film pattern through the upper oxide film and subsequently forming holes to expose part of said underlayer through said base oxide film within the hole pattern, both by the use of etching processing;
   etching off part of the nitride film pattern exposed at least from said wiring grooves under a condition that the etching selection rate on the nitride film to the oxide film is high; and
   filling said holes and said wiring grooves with wiring metal;

wherein the profile of said nitride film pattern is formed with substantially the same shape as the opening of said wiring groove; and wherein dry etching is used for continuous formation of said wiring grooves and holes; and the etching gas contains $CH_2F_2$ gas.

7. A semiconductor device manufacturing method comprising the steps of:

forming a basic oxide film on a substrate;

forming a nitride film pattern on the basic oxide film with a hole pattern;

forming an upper oxide film on said basic oxide film and said nitride film pattern;

forming a wiring groove in said upper oxide film to expose a portion of said nitride film pattern;

etching a hole through said basic oxide film to expose part of said substrate by using said nitride film pattern as a mask;

etching said nitride film pattern to substantially remove said nitride film pattern;

forming a barrier metal layer in said hole and said wiring groove; and filling said hole and said wiring groove with a wiring metal.

* * * * *